(12) United States Patent
Ishikawa

(10) Patent No.: US 6,523,146 B1
(45) Date of Patent: Feb. 18, 2003

(54) OPERATION PROCESSING APPARATUS AND OPERATION PROCESSING METHOD

(75) Inventor: Toshihiro Ishikawa, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/449,831

(22) Filed: Nov. 26, 1999

(30) Foreign Application Priority Data

Oct. 18, 1999 (JP) ............................................ 11-294816

(51) Int. Cl.[7] ............................................ H03M 13/23
(52) U.S. Cl. ...................................................... 714/786
(58) Field of Search ........................................ 714/786

(56) References Cited

U.S. PATENT DOCUMENTS

| | | | | |
|---|---|---|---|---|
| 4,128,890 A | * | 12/1978 | Irwin et al. | 708/306 |
| 4,669,084 A | * | 5/1987 | Hartman et al. | 714/786 |
| 5,612,974 A | * | 3/1997 | Astrachan | 375/295 |
| 5,954,836 A | * | 9/1999 | Wang | 714/786 |
| 5,964,825 A | * | 10/1999 | Seshan et al. | 708/231 |
| 6,081,921 A | * | 6/2000 | Simanapalli | 714/786 |

FOREIGN PATENT DOCUMENTS

| | | | |
|---|---|---|---|
| JP | 6-44051 | | 2/1994 |
| JP | 6-83853 A | * | 3/1994 |
| JP | 11-46148 | | 2/1999 |

OTHER PUBLICATIONS

An English Language abstract of JP 6–44051.
English Language Abstract of JP 11–46148.

* cited by examiner

Primary Examiner—Stephen M. Baker
(74) Attorney, Agent, or Firm—Greenblum & Bernstein, P.L.C.

(57) ABSTRACT

Shift register 5 stores data read from data memory 1 through data bus 3, and supplies a shift output to shift register 4. Shift register 4 stores operation target data read from data memory 1 through data bus 3, shifts operation target data one bit by one bit, and supplies operation target data to bit selection circuit 7. Bit selection circuit 7 selects bit data, which is placed at a position designated by register 6, from data stored in shift register 4. Multi-input exclusive OR circuit 8 executes exclusive OR operations of all bits of bit data output from bit selection circuit 7, simultaneously, and outputs an operation result of one bit to shift register 9. This makes it possible to efficiently perform convolutional code processing at high speed.

20 Claims, 26 Drawing Sheets

OPERATION OF SELECTOR 122 OF
CONFIGURATION UNIT 123

| CONTROL SIGNAL B | CONTROL SIGNAL A | SELECTIVE OUTPUT |
|---|---|---|
| 0 | 1 | FIRST INPUT |
| 1 | 1 | SECOND INPUT |
| 1 | 0 | THIRD INPUT |
| 0 | 0 | OPTION |

OPERATION PROCESSING APPARATUS AND OPERATION PROCESSING METHOD

BACKGROUND OF THE INVENTION

1. Field of the Invention

The present invention relates to an operation processing apparatus incorporated into a mobile communication apparatus and an operation processing method, and particularly one that realizes effective processing of a convolutional encoder and a turbo encoder thereof.

2. Description of the Related Art

In recent years, a digital signal processor (hereinafter referred to as DSP) is frequently used as a type of processor embedded into an apparatus such as a cellular phone, etc in accordance with movement toward digitalization in the field of the mobile communications. In data communications through a mobile radio communication network, since a bit error frequently occurs, error correction processing must be performed. As one of error correcting methods, there is convolutional code processing, and DSP is used to execute convolutional code processing.

The following will explain conventional code processing briefly.

A convolutional code is produced by modulo 2-adder of an input bit and a preceding constant bit, and a plurality of code data is produced in accordance with input of one bit. When code data of n bits is produced with respect to the input of one information bit, a coding rate results in 1/n. A constraint length K, which is the number of input information bits exerting an influence upon code data of an output, is equal to the number of stages of shift registers used in modulo 2-adder.

This code data is fixed by the input bit and the state of preceding (K−1) input bits. Therefore, a predefined number of bits, which are selected from data of K bits, are used as an operation target and all selected bits are EXCLUSIVE ORed, whereby convolutional processing is executed.

An operation processing apparatus for carrying out this convolutional processing at high speed is disclosed in Unexamined Japanese Patent Publication No. Hei 6-44051.

This apparatus comprises a data register for storing operation target data, a bit selection circuit for designating a configuration bit of operation target data output from the data register for each bit and for outputting bit selection data, and a multi-input exclusive OR circuit for executing EXCLUSIVE OR operations with respect to all bits of bit selection data output from this bit selection circuit, simultaneously.

In the multi-input exclusive OR circuit, the simultaneous execution of the exclusive OR operations makes it possible to carry out the selection of the operation target bit in convolutional code processing and the exclusive OR operations at high speed.

However, since the above-mentioned conventional operation processing apparatus realizes data update processing of K bits severing as an operation target by use of software, it is necessary to provide processing in which data stored in the shift register is read, shifted by a shift operating unit, etc. and written back to the resister. In this series of processing, since more than ten steps per one bit are needed, the above-mentioned operation processing apparatus is still not good enough in view of the high speed performance of the entirety of convolutional code processing.

SUMMARY OF THE INVENTION

It is an object of the present invention to provide an operation processing apparatus, which is capable of efficiently performing convolutional code processing and turbo code processing at high speed and to provide an operation processing method.

This object can be achieved by comprising a data register as a first shift register, and a second register for shift inputting uncoded data to the first shift register, and executing exclusive OR operations with respect to all bit data selected from data stored in the first shift register, simultaneously.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which.

DETAILED DESCRIPTION OF THE PREFERRED EMBODIMENTS

Embodiments of the present invention will now be specifically described with reference to the accompanying drawings.

(First Embodiment)

Figure 1:
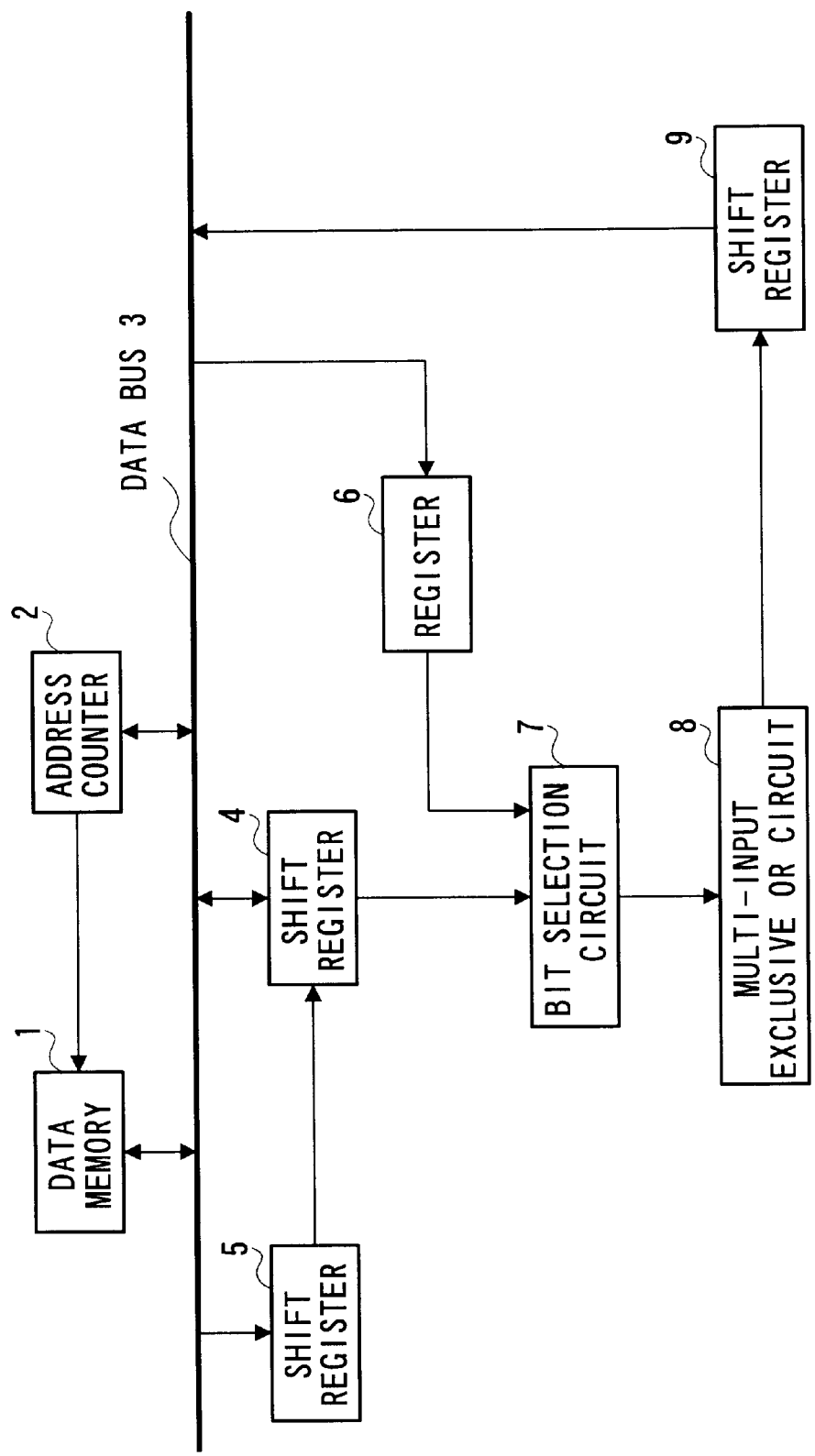
FIG. 1 is a block diagram showing a configuration of an operation processing apparatus according to a first embodiment of the present invention.

FIG. 1 is a block diagram showing a configuration of an operation processing apparatus according to a first embodiment. In FIG. 1, data memory 1 stores information data, which is convolutional encoded. Address counter 2 is connected to data memory 1 and supplies an address of data stored in data memory 1 to data memory 1. Data bus 3 transfers data read from data memory 1.

Shift register 4 stores operation target data read from data memory 1 through data bus 3, shifts the data one bit by one bit as receiving a shift output from a shift register 5 to be described later as a shift input, and supplies operation target data to a bit selection circuit 7 to be described later.

Shift register 5 stores data read from data memory 1 through data bus 3, shifts the data one bit by one bit and supplies the shift output to shift register 4.

Register 6 retains bit selective information which designates bit position of target data for exclusive OR operation. Bit selection circuit 7 selects bit data of the position designated by register 6 from data stored in shift register 4, and outputs the selected bit data to multi-input exclusive OR circuit 8.

Multi-input exclusive OR circuit 8 executes exclusive OR operations with respect to all bits of bit data output from bit selection circuit 7, simultaneously, and outputs an operation result of one bit to shift register 9. Shift register 9 retains outputs of multi-input exclusive OR circuit 8 as shifting them one bit by one bit as a shift input.

Figure 2:
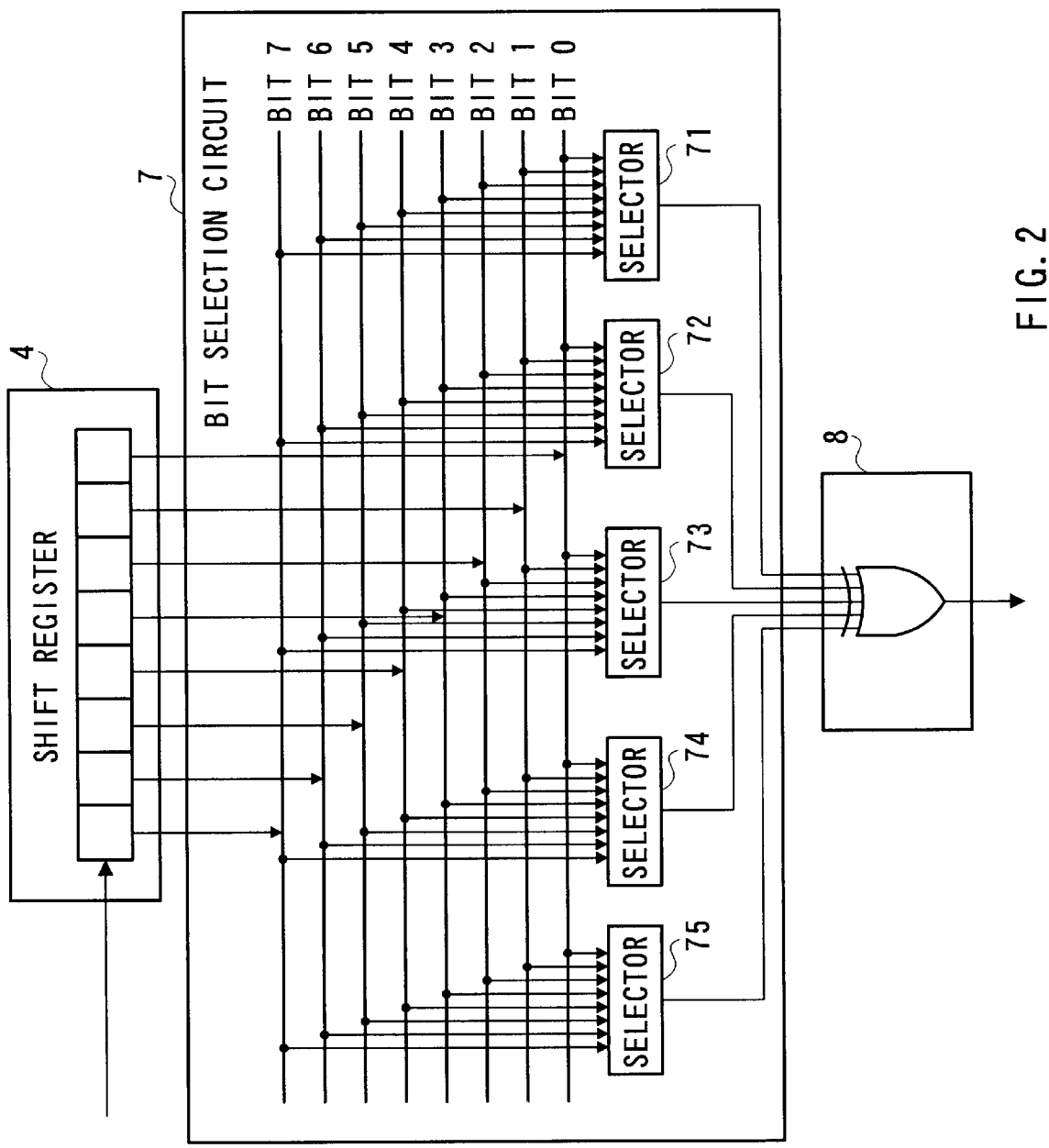
FIG. 2 is a view showing a configuration of a bit selection circuit provided in the operation processing apparatus according to the first embodiment of the present invention.

FIG. 2 is a view showing a configuration example of bit selection circuit 7. Bit selection circuit 7 is connected to shift register 4, and each 8 bits of shift register 4 are input thereto. Selectors 71 to 75, which are provided in bit selection circuit 7, perform 8-bit inputs and one-bit output, that is, each selector inputs each 8 bits of shift register 4 and outputs one bit to multi-input exclusive OR circuit 8.

Next, an explanation will be given of an operation, which is carried out when the operation processing apparatus shown in FIGS. 1 and 2 performs processing equivalent to the convolutional encoder having constraint length=7 and a coding rate of 1/2 shown in FIG. 3. In this case, it is assumed that a bit width of a data path of each of data memory 1, address counter 2, data bus 3, shift registers 4, 5 and registers 6 and 9 is 8 bits. Also, it is assumed that 8 bits of code target data are used as one word and stored in data memory 1 from address 0 in order.

First of all, as a first step, head address 0 of data is set to address counter 2.

Next, as a second step, data of the address shown by counter 2 is read from data memory 1, and stored in shift register 4 through data bus 3. Also, a value of address counter 2 is incremented by one.

Next, as a third step, data of address shown by address counter 2 is read from data memory 1 and stored in shift register 5 through data bus 3.

Figure 3:
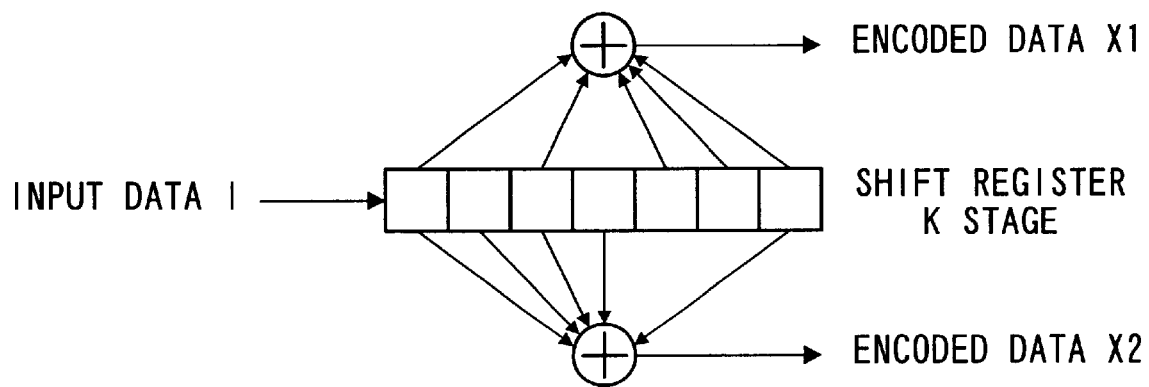
FIG. 3 is a view showing one example of a capability of a convolutional encoder.

Next, as a fourth step, data b'01010111' of a bit position of the shift register, which is necessary for generating encoded data X1 in FIG. 3, is stored into register 6.

Next, as a fifth step, encoded data is generated by bit selection circuit 7 and multi-input exclusive OR circuit 8, and the generation result is shift input to shift register 9 and stored therein. At this time, selectors 71 to 75, which are provided in the bit selection circuit 7 shown in FIG. 2, operate in accordance with bit position data retained in register 6. Namely, selectors 71 to 75 select bits "0", "1", "2", "4", "6", respectively, and output them to multi-input exclusive OR circuit 8.

Figure 6:
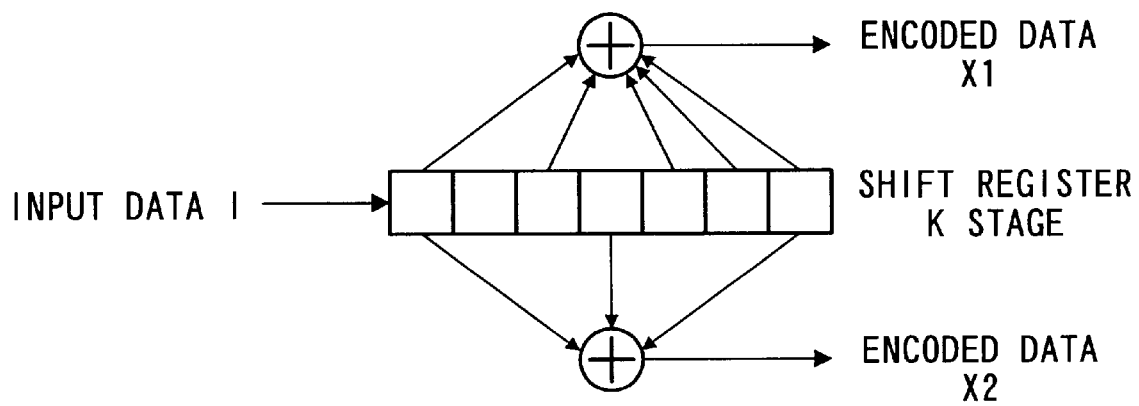
FIG. 6 is a view showing one example of a capability of a convolutional encoder.

Next, as a sixth step, data b'01111001' of bit position of the shift register, which is necessary for generating encoded data X2 in FIG. 6, is stored into register 6.

Next, in a seventh step, encoded data is generated by bit selection circuit 7 and multi-input exclusive OR circuit 8, and the generation result is shift input to shift register 9, and stored therein. At this time, selectors 71 to 75, which are provided in the bit selection circuit 7 shown in FIG. 2, operate in accordance with bit position data retained in register 6. Namely, selectors 71 to 75 select bits "0", "3", "4", "5", "6", respectively, and output them to multi-input exclusive OR circuit 8.

Next, as an eighth step, shift registers 4 and 5 shift right by one bit, simultaneously.

The execution of processing, including the first to eighth steps, makes it possible to carry out encoding process corresponding to one bit of information data.

Then, since encoded data of 8 bits is stored in shift register 9 by repeating fourth to eighth steps four times, a value of shift register 9 is stored in data memory 1 as a ninth step.

Then, since the content of shift register 5 is all shifted out by further repeating fourth to eighth steps four times, namely, eight times in all, the operation of the third step is performed so as to replenish input data.

Thus, the second shift register for providing the shift input to the first shift register, which supplies information data as a code target, is provided, and update processing of information data as a code target is performed as shifting data one bit by one bit. Since this eliminates the need for performing processing in which data of the shift register is read, shifted by a shift operating unit, etc and written back to the resister, it is possible to perform convolutional code processing at high speed.

Also, the shift register for storing read data and the shift register for supplying information data as a code target are made different from each other, allowing information data as a code target to be continuously supplied.

In addition, if the register for supplying information data can output the data one bit by one bit, it is not needed that the register is the shift register.

(Second Embodiment)

A second embodiment is a specific form in which the number of bits selected by the bit selection circuit can be flexibly changed.

Figure 4:
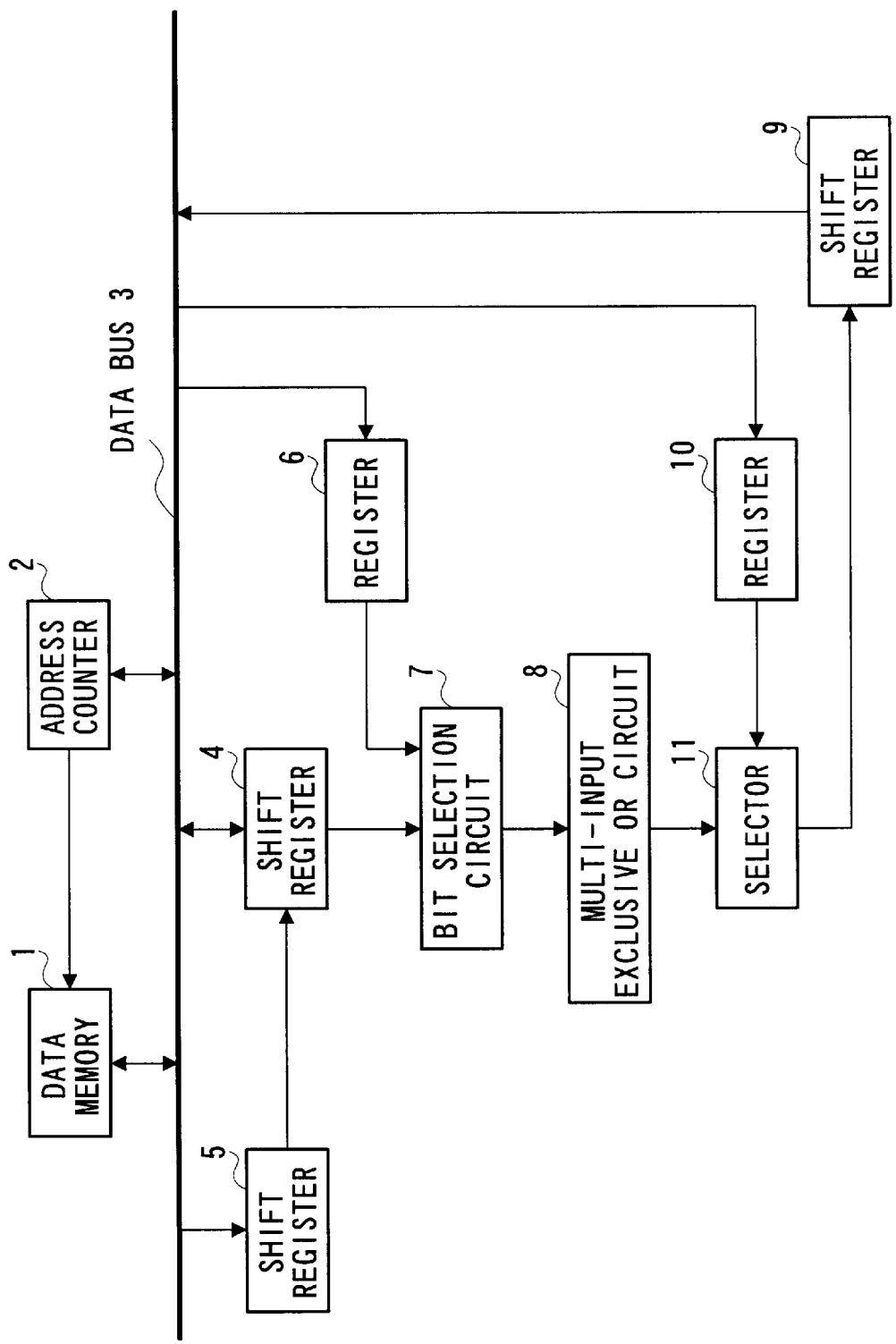
FIG. 4 is a block diagram showing a configuration of an operation processing apparatus according to a second embodiment.
Figure 5:
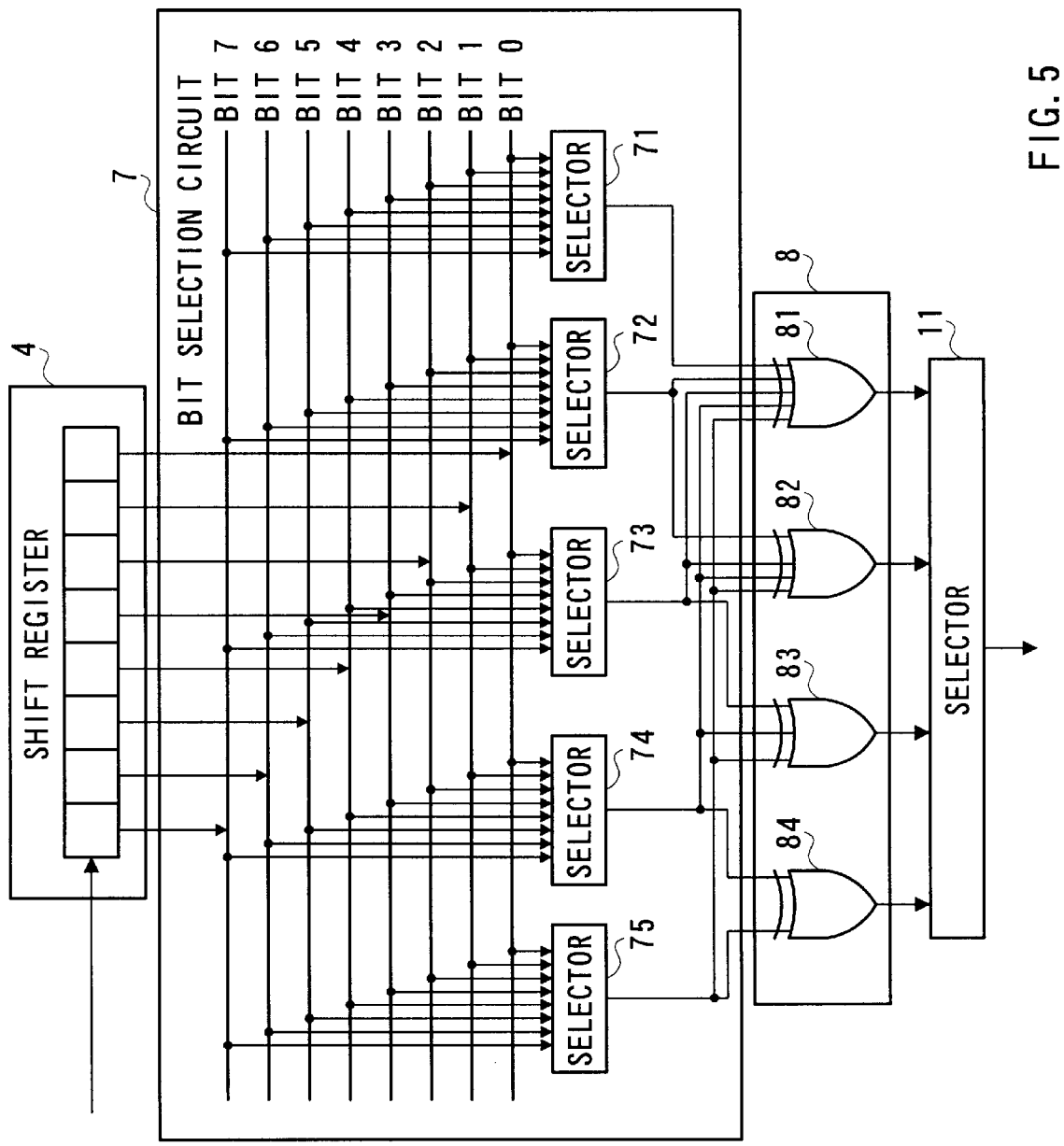
FIG. 5 is a view showing configurations of a bit selection circuit and a multi-input exclusive OR circuit provided in the operation processing apparatus according to the second embodiment.

FIG. 4 is a block diagram showing a configuration of the operation processing apparatus according to the second embodiment, and FIG. 5 is a view showing configurations of bit selection circuit 7 and multi-input exclusive OR circuit 8 provided in the operation processing apparatus according to the second embodiment. In the operation processing apparatus shown in FIGS. 4 and 5, the same reference numerals as those of FIGS. 1 and 2 are added to configuration portions common to the apparatus shown in FIGS. 1 and 2, and the explanation will be omitted.

Also, as shown in FIG. 5, multi-input exclusive OR circuit 8 comprises four multi-input exclusive OR circuits each having a different number of input bits. In other words, multi-input exclusive OR circuit 8 comprises multi-input exclusive OR circuit 81 with five inputs, multi-input exclusive OR circuit 82 with four inputs, multi-input exclusive OR circuit 83 with three inputs, and multi-input exclusive OR circuit 84 with two inputs.

Register 10 retains information showing by which one of four exclusive OR circuits 81 to 84 exclusive OR operation is performed.

Selector 11 has four inputs and one output, and is connected to exclusive OR circuits 81 to 84 at an input side and connected to shift register 9 at an output side. Then, selector 11 selects an exclusive OR circuit to be used in accordance with information output from register 10.

Next, an explanation will be given of an operation, which is carried out when the operation processing apparatus shown in FIGS. 4 and 5 performs processing equivalent to the convolutional encoder in which constraint length=7 and a coding rate is 1/2 shown in FIG. 6 and the number of bits as an operation target of exclusive OR is different in encoded data X1 and X2 (X1 is 5 bits and X2 is 3 bits). In this case, it is assumed that a bit width of a data path of each of data memory 1, address counter 2 data bus 3, shift registers 4, 5 and registers 6 and 9 is 8 bits. Also, it is assumed that 8 bits of code target data are used as one word and stored from address 0 in order.

First of all, as a first step, head address 0 of data is set to address counter 2.

Next, as a second step, data of the address shown by counter 2 is read from data memory 1, and stored in shift register 4 through data bus 3. Also, a value of address counter 2 is incremented by one.

Next, as a third step, data of address shown by address counter 2 is read from data memory 1 and stored in shift register 5 through data bus 3.

Next, as a fourth step, data b'01010111' of bit position of the shift register, which is necessary for generating encoded data X1 in FIG. 6, is stored into register 6.

Next, in a fifth step, information bit number 5, which is necessary for generating encoded data X1 in FIG. 6, is stored into register 10.

Next, in a sixth step, encoded data is generated by bit selection circuit 7 and multi-input exclusive OR circuit 8, and the generation result is shift input to shift register 9 through selector 11, and stored therein. At this time, selectors 71 to 75, which are provided in the bit selection circuit 7 shown in FIG. 5, operate in accordance with bit position data retained in register 6. Namely, selectors 71 to 75 select bits "0", "1", "2", "4", "6", respectively, and output them to multi-input exclusive OR circuit 8.

Next, as a seventh step, data b'01001001' of bit position of the shift register, which is necessary for generating encoded data X2 in FIG. 6, is stored into register 6.

Next, in an eighth step, information bit number 3, which is necessary for generating encoded data X2 in FIG. 6, is stored into register 10.

Next, in a ninth step, encoded data is generated by bit selection circuit 7 and multi-input exclusive OR circuit 8, and the generation result is shift input to shift register 9 through selector 11, and stored therein. At this time, selectors 71 to 75, which are provided in the bit selection circuit 7 shown in FIG. 5, operate in accordance with bit position data retained in register 6. Namely, selectors 71 to 75 select bits "0", "3", "6", respectively, and output them to multi-input exclusive OR circuit 8.

Next, as a tenth step, shift registers 4 and 5 shift right by one bit, simultaneously.

The execution of processing, including the first to tenth steps, makes it possible to carry out code processing corresponding to one bit of information data.

Then, since encoded data of 8 bits is stored in shift register 9 by repeating fourth to tenth steps four times, a value of shift register 9 is stored in data memory 1 as an eleventh step.

Then, since the content of shift register 5 is all shifted out by further repeating fourth to tenth steps four times, namely, eight times in all, the operation of the third step is performed so as to replenish input data.

Thus, a plurality of exclusive OR circuits having a different input is prepared, and an exclusive OR circuit is appropriately selected in accordance with the number of bits as an operation target. This makes it possible to flexibly deal with a case of performing processing equivalent to the convolutional encoder having a different bit number as an operation target of exclusive OR.

(Third Embodiment)

A third embodiment is a specific form in which a number of wiring of the bit selection circuit in the operation processing apparatus is reduced to lessen an area of a wiring region at the time of forming LSI.

Figure 7:
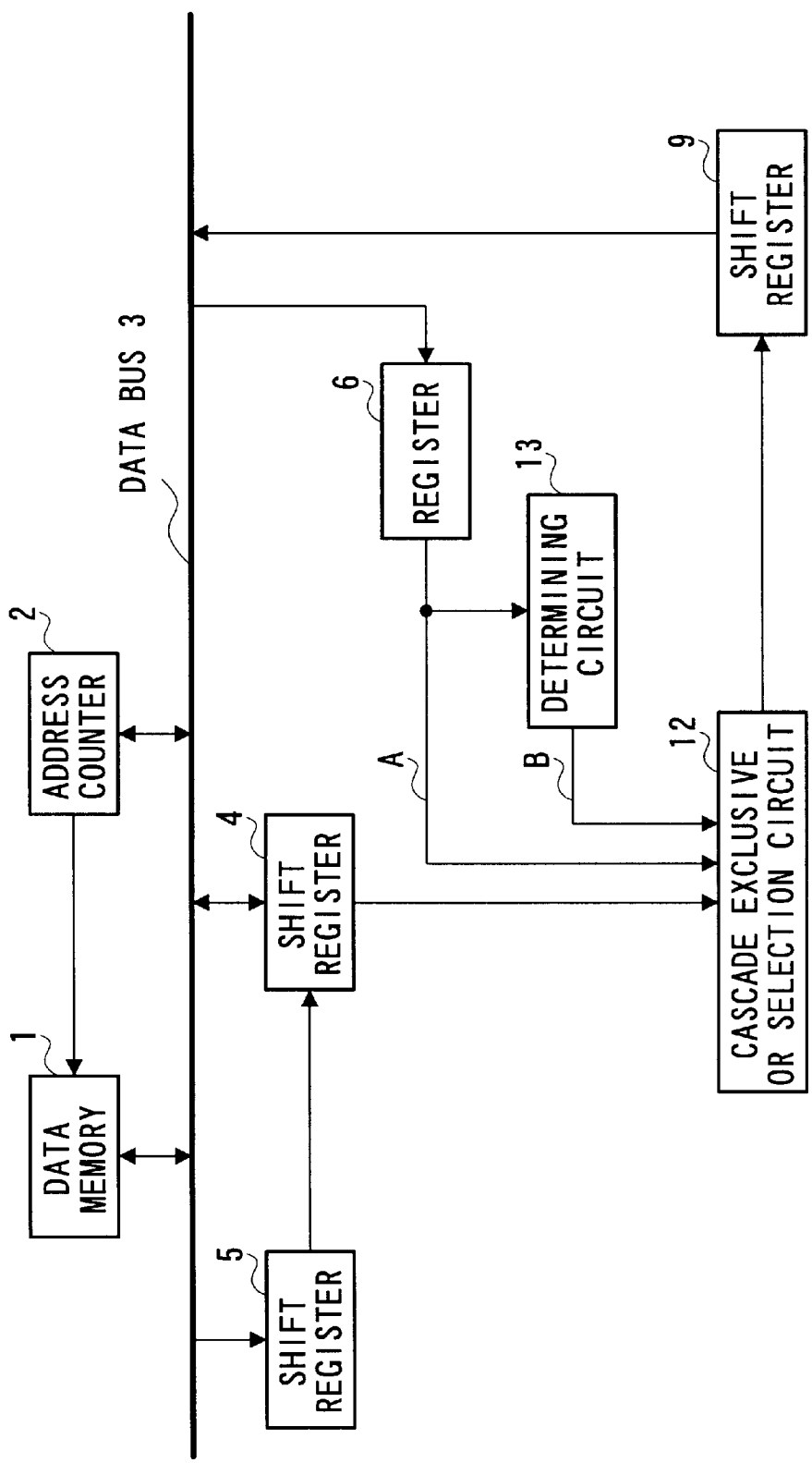
FIG. 7 is a block diagram showing a configuration of an operation processing apparatus according to a third embodiment.

FIG. 7 is a block diagram showing a configuration of an operation processing apparatus according to the third embodiment.

In the operation processing apparatus shown in FIG. 7, the same reference numerals as those of FIG. 4 are added to configuration portions common to the apparatus shown in FIG. 4, and the explanation will be omitted.

As compared with the operation processing apparatus of FIG. 4, the operation processing apparatus of FIG. 7 adopts the configuration in which cascade exclusive OR circuit 12 and determining circuit 13 are added in place of bit selection circuit 7, multi-input exclusive OR circuit 8, register 10, and selector 11.

Figure 8:
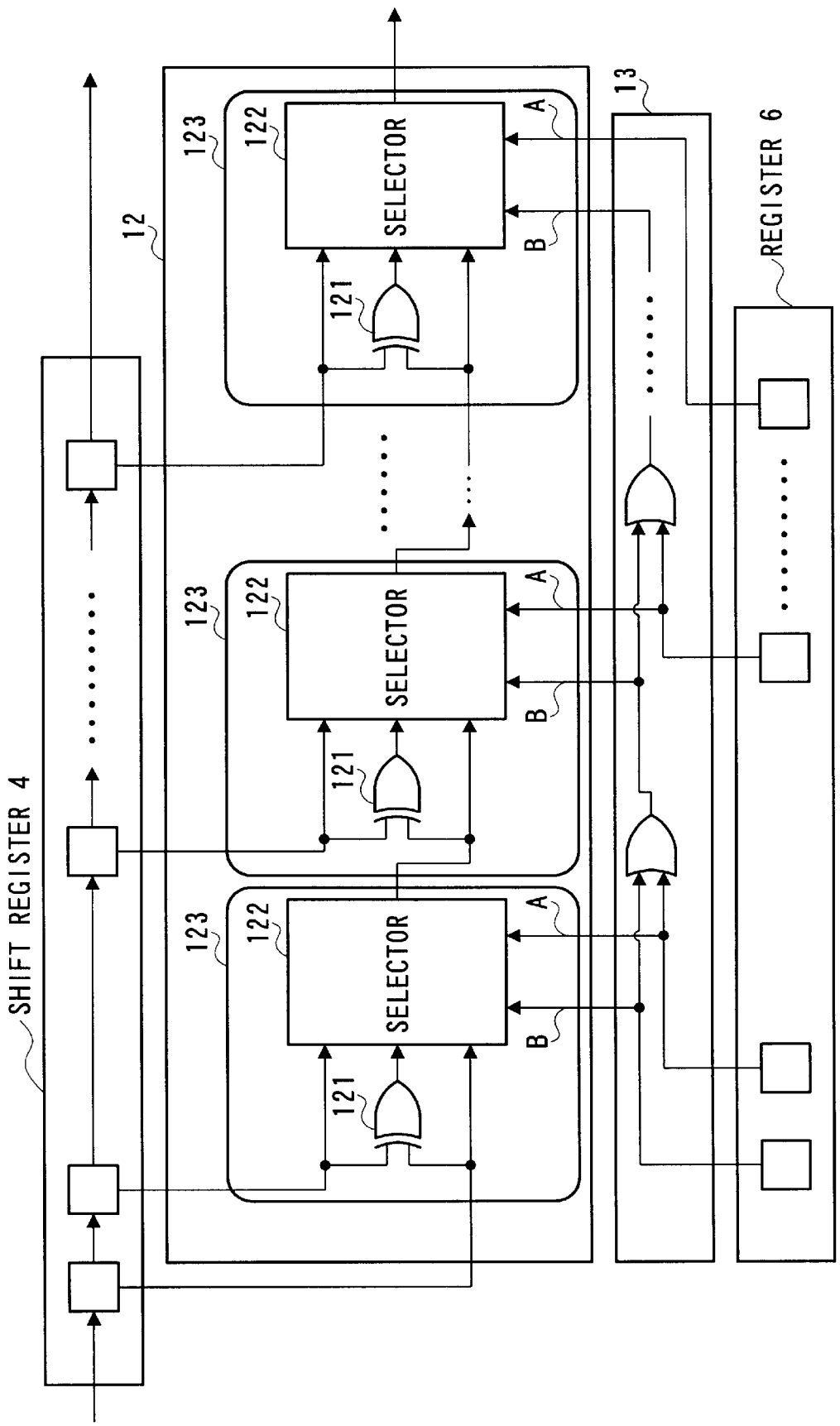
FIG. 8 is a view showing configurations of a cascade exclusive OR selection circuit and a determining circuit provided in the operation processing apparatus according to the third embodiment.

FIG. 8 is a view showing a configuration of cascade exclusive OR selection circuit 12. As shown in FIG. 8, cascade exclusive OR selection circuit 12 configures one unit having exclusive OR circuit 121 with two inputs and one output and selector 122. Hereinafter, one unit having exclusive OR circuit 121 and selector 122 is referred to as "configuration unit 123".

The number of configuration units 123 is one that is obtained by subtracting "1" from "n", the number of stages of shift register 4. For example, if the number of stages of shift register 4 is 8, the number of configuration units 123 is 7.

Register 6 is connected to determining circuit 13 and selector 122 of each configuration unit 123, and outputs bit selective information. Bit selective information is used as control signal A, which designates a bit position of target data of the exclusive OR operation and which instructs whether or not a bit of i-th stage of shift register 4 is used as an input of exclusive OR circuit 121 of i-th stage, simultaneously (i is a natural number of less than or equal to n).

Determining circuit 13 is connected to selector 122 of each configuration unit 123, and outputs a control signal. Control signal B is a signal, which determines whether or not a bit, which is present before i-th stage of shift register 4, is used as an input of exclusive OR circuit 121 of i-th stage.

Exclusive OR circuit 121 of the first stage inputs an output of the first stage of shift register 4 and a bit output of the second stage of shift register 4. Also, exclusive OR circuit 121 of i-th stage other than the first stage inputs a bit output of (i−1)th stage of selector 122 and a bit output of (i+1)th stage of shift register 4.

Selector 122 of the first stage uses a bit output of the second stage of shift register 4 as first input data, and uses a bit output of exclusive OR circuit 121 of the first stage as second input data, and uses a bit output of the first stage of shift register 4 as third input data. Also, selector 122 of i-th stage other than the first stage uses a bit output of (i+1) th stage of shift register 4 as first input data, uses a bit output of i-th exclusive OR circuit 121 as second input data, and uses a bit output of selector 122 of (i−1) th stage as third input data. Then, each selector outputs any one of first input data to third input data in accordance with values of control signal A and control signal B.

By this connectional relationship, (n−1) configuration units 123 are connected in a multi-stage cascade manner in the cascade exclusive OR selection circuit 12. The output of exclusive OR selection circuit 12 is shift input to shift register 9.

Next, an explanation will be given of an operation, which is carried out when the operation processing apparatus shown in FIGS. 7 and 8 performs processing equivalent to the convolutional encoder shown in FIG. 6 similar to the second embodiment.

First of all, as a first step, head address 0 of data is set to address counter 2.

Next, as a second step, data of the address shown by counter 2 is read from data memory 1, and stored in shift register 4 through data bus 3. Also, a value of address counter 2 is incremented by one.

Next, as a third step, data of address shown by address counter 2 is read from data memory 1 and stored in shift register 5 through data bus 3.

Next, as a fourth step, data b'01010111 of a bit position of the shift register, which is necessary for generating encoded data X1 in FIG. 6, is stored into register 6.

Next, as a fifth step, cascade exclusive OR selection circuit 12 operates to generate encoded data and shift inputs the generation result, and stores it to shift register 9. At this time, each selector 122, which is provided in cascade exclusive OR selection circuit 12, performs a selective operation shown in FIG. 9 in accordance with control signals A and B.

Next, in a sixth step, data b'01001001' of a bit position of the shift register, which is necessary for generating encoded data X2 in FIG. 6, is stored into register 6.

In a seventh step, cascade exclusive OR selection circuit 12 operates to generate encoded data and shift inputs the generation result, and stores it to shift register 9. At this time, each selector 122, which is provided in cascade exclusive OR selection circuit 12, performs a selective operation shown in FIG. 9 in accordance with control signals A and B.

Next, in an eighth step, shift registers 4 and 5 shift right by one bit simultaneously.

The execution of processing, including the first to eighth steps, makes it possible to carry out code processing corresponding to one bit of information data.

Then, since encoded data of 8 bits is stored in shift register 9 by repeating fourth to eighth steps four times, a value of shift register 9 is stored in data memory 1 as a ninth step.

Then, since the content of shift register 5 is all shifted out by further repeating fourth to eighth steps four times, namely, eight times in all, the operation of the third step is performed so as to replenish input data.

Thus, the use of the cascade exclusive OR selection circuit eliminates the need for the step for storing the number of information bits in the register, which is needed in the second embodiment. As a result, convolutional code processing can be performed at higher speed than the second embodiment.

Also, as is obvious from the comparison between FIGS. 8 and 5, since the operating processing apparatus of the third embodiment can simplify the wire structure so as to an amount of wiring as maintaining a capability, which is equivalent to the operation processing apparatus of the second embodiment, an area of a wiring region can be reduced at the time of forming LSI.

(Fourth Embodiment)

A fourth embodiment is a specific form in which a bit selective position of operation target data corresponding to each encoded data can be changed at high speed in a case of generating a plurality of encoded data with respect to the input of one information bit.

Figure 10:
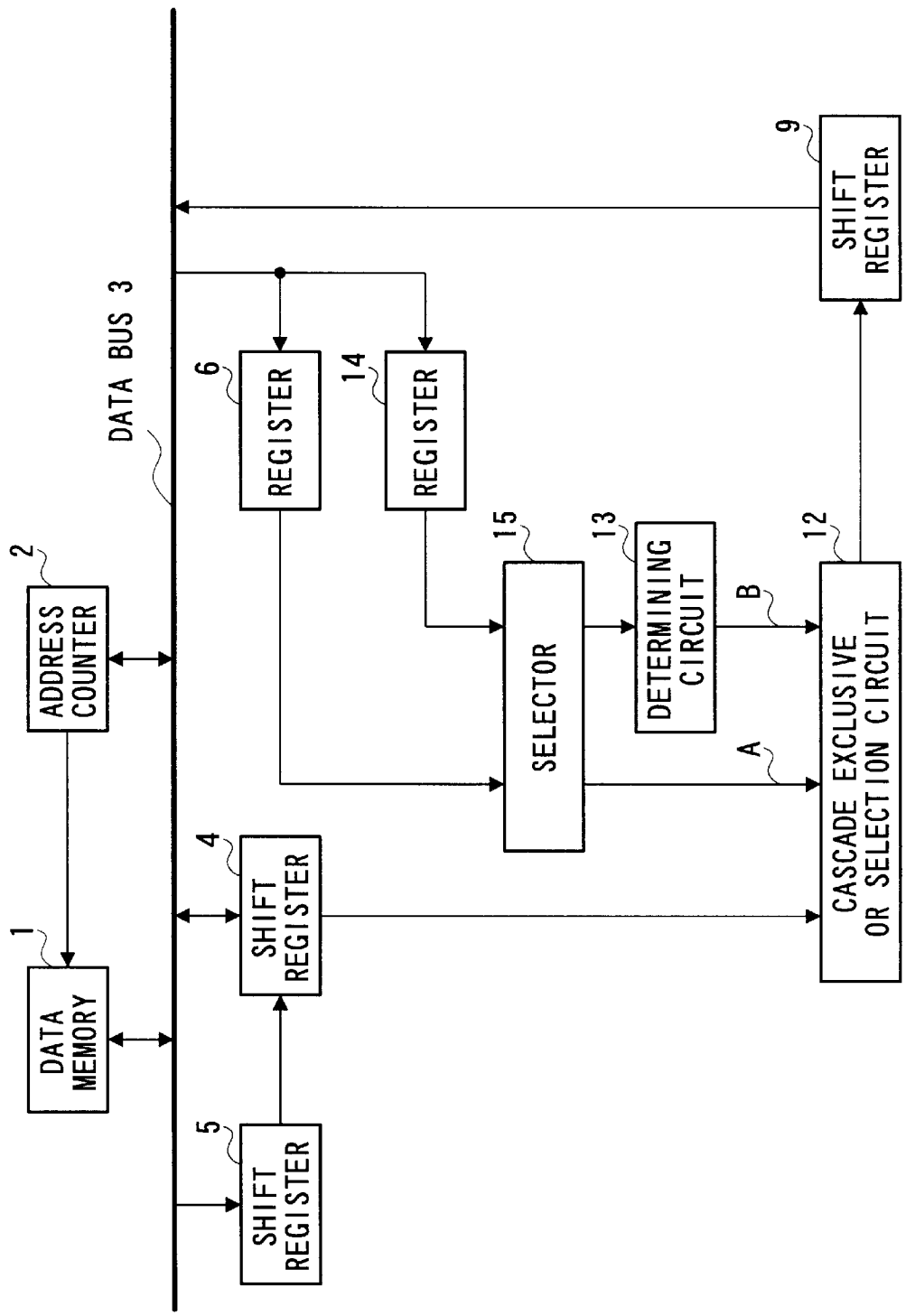
FIG. 10 is a block diagram showing a configuration of an operation processing apparatus according to a fourth embodiment.

FIG. 10 is a block diagram showing a configuration of the operation processing apparatus according to the fourth embodiment. In the operation processing apparatus shown in FIG. 10, the same reference numerals as those of FIG. 7 are added to the configuration portions common to those of FIG. 7, and the explanation will be omitted.

The operation processing apparatus shown in FIG. 10 adopts the configuration in which register 14 and selector 15 are added as compared with the operation processing apparatus of FIG. 7.

Register 14 retains bit selective information corresponding to second encoded data different from register 6. Selector 15 selects any one of bit selective information output from registers 6 and 14, and outputs it to cascade exclusive OR selection circuit 12 and determining circuit 13.

Next, an explanation will be given of an operation, which is carried out when the operation processing apparatus of FIG. 10 performs processing, which is equivalent to the convolutional encoder shown in FIG. 6.

First of all, as a first step, head address 0 of data is set to address counter 2.

Next, as a second step, data of the address shown by address counter 2 is read from data memory 1, and stored in shift register 4 through data bus 3. Also, a value of address counter 2 is incremented by one.

Next, as a third step, data of the address shown by address counter 2 is read from data memory 1 and stored in shift register 5 through data bus 3.

Next, as a fourth step, data b'01010111' of a bit position of the shift register, which is necessary for generating encoded data X1 in FIG. 6, is stored into register 6.

Next, as a fifth step, data b'01001001' of a bit position of the shift register, which is necessary for generating encoded data X2 in FIG. 6, is stored into register 14.

Next, as a sixth step, selector 15 selects bit selective information of register 6 and outputs it, so that cascade exclusive OR selection circuit 12 operates to generate encoded data and shift inputs the generation result, and stores it to shift register 9. At this time, each selector 122, which is provided in cascade exclusive OR selection circuit 12, performs a selective operation shown in FIG. 9 in accordance with control signals A and B.

Next, as a seventh step, selector 15 selects bit selective information of register 14 and outputs it, so that cascade exclusive OR selection circuit 12 operates to generate encoded data and shift inputs the generation result, and stores it to shift register 9. At this time, each selector 122, which is provided in cascade exclusive OR selection circuit 12, performs a selective operation shown in FIG. 9 in accordance with control signals A and B.

Next, in an eighth step, shift registers 4 and 5 shift right by one bit simultaneously.

The execution of processing, including the first to eighth steps, makes it possible to carry out code processing corresponding to one bit of information data.

Then, since encoded data of 8 bits is stored in shift register 9 by repeating fourth to eighth steps four times, a value of shift register 9 is stored in data memory 1 as a ninth step.

Then, since the content of shift register 5 is all shifted out by further repeating fourth to eighth steps four times, namely, eight times in all, the operation of the third step is performed so as to replenish input data.

Thus, the change of bit selective position of operation target data corresponding to each encoded data at high speed eliminates the need for rewriting bit selective position data frequently. As a result, in the case where the coding rate is 1/2 or less, that is, a plurality of encoded data is generated with respect to the input of one information bit, convolutional code processing can be carried out at high speed.

(Fifth Embodiment)

A fifth embodiment is a specific form in which code processing of turbo code, which is one kind of error correction code similar to the convolutional code, is performed at high speed. The turbo code is proposed as an error correction code largely exceeding the performance of convolutional code, and the application to a radio communication system has been taken into consideration.

Figure 11:
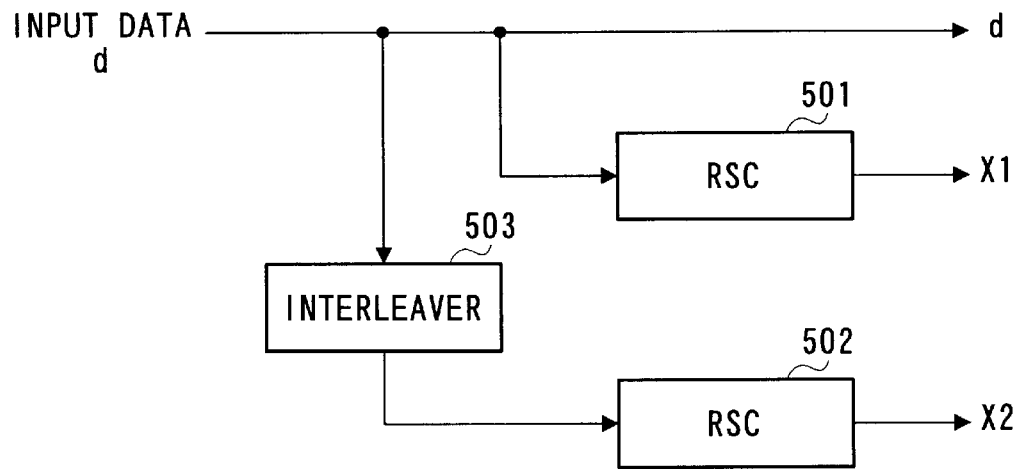
FIG. 11 is a view illustrating a configuration of a turbo encoder.

FIG. 11 is a view showing a configuration example of a turbo encoder. The turbo encoder comprises two recursive systematic convolutional encoders (hereinafter referred to as "RSC") 501, 502, and interleaver 503 provided therebetween.

Interleaver 503 realizes interleave by interchanging data bit sequence at random. For example, if data bit sequence {d1, d2, d3, d4, d5, d6, d7, d8} is input to interleaver 503, data bit sequence {d4, d6, d2, d8, d5, d1, d7, d3} is output. As encoding procedures, information sequence is encoded by RSC 501, and random interleaving is provided to information sequence corresponding to one frame, thereafter encoding is performed by RSC 502. RSC 501 and RSC 502 adopt the same configuration.

Figure 12:
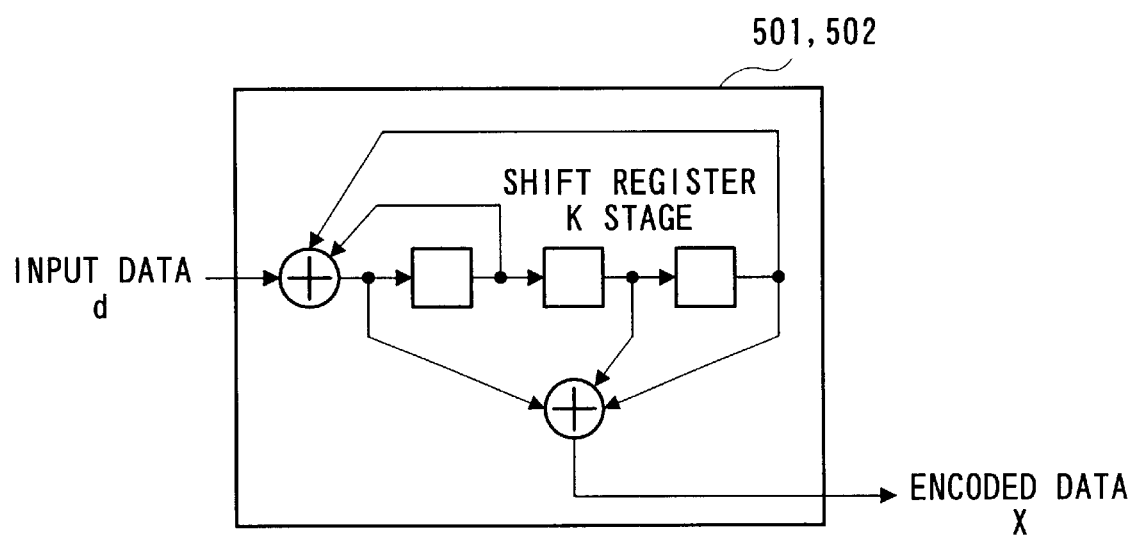
FIG. 12 is a view illustrating a capability of a recursive systematic convolutional encoder configuring the turbo encoder.

FIG. 12 is a view showing the configuration examples of RSCs 501 and 502.

Figure 13:
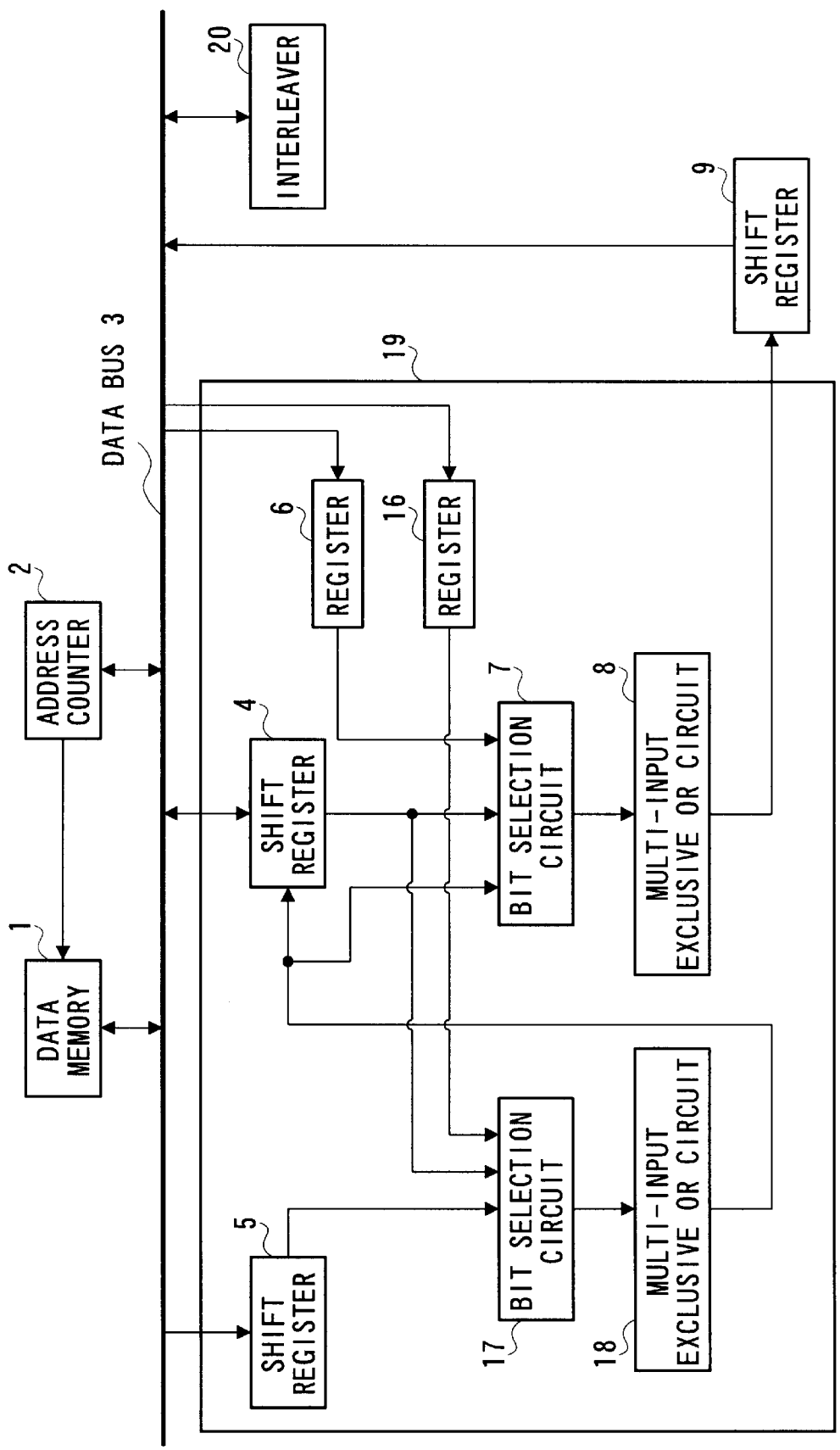
FIG. 13 is a block diagram showing a configuration of an operation processing apparatus according to a fifth embodiment.

FIG. 13 is a block diagram showing the configuration of the operation processing apparatus according to the fifth embodiment. In the operation processing apparatus shown in FIG. 13, the same reference numerals as those of FIG. 1 are added to configuration portions common to the apparatus shown in FIG. 1, and the explanation will be omitted.

The operation processing apparatus of FIG. 13 adopts a configuration in which register 16, bit selection circuit 17, multi-input exclusive OR circuit 18, and interleaver 20 are added as compared with the operation processing apparatus of FIG. 1. Then, shift registers 4, 5 and registers 6, 16, bit selection circuit 7, and multi-input exclusive OR circuits 8, 18 configure RSC 19. RSC 19 corresponds to RSC 501 of FIG. 11 or RSC 502 thereof.

Register 16 retains bit selective information corresponding to second encoded data different from register 6.

Bit selection circuit 17 selects bit data of the position designated by register 16 from four bits, including one bit of the output of shift register 5 and three bits of shift register 4, and outputs the bit to multi-input exclusive OR circuit 18.

Multi-input exclusive OR circuit 18 executes exclusive OR operations of all bits of bit data output from bit selection circuit 17, simultaneously, and output an operation result of one bit to shift register 4 and bit selection circuit 7.

Bit selection circuit 7 selects bit data of the position designated by register 6 from four bits, including one bit of the output of multi-input exclusive OR circuit 18 and three bits of shift register 4, and outputs the bit to multi-input exclusive OR circuit 8.

Interleaver 20 interchanges bit sequence of input data at random, and outputs data.

Figure 14:
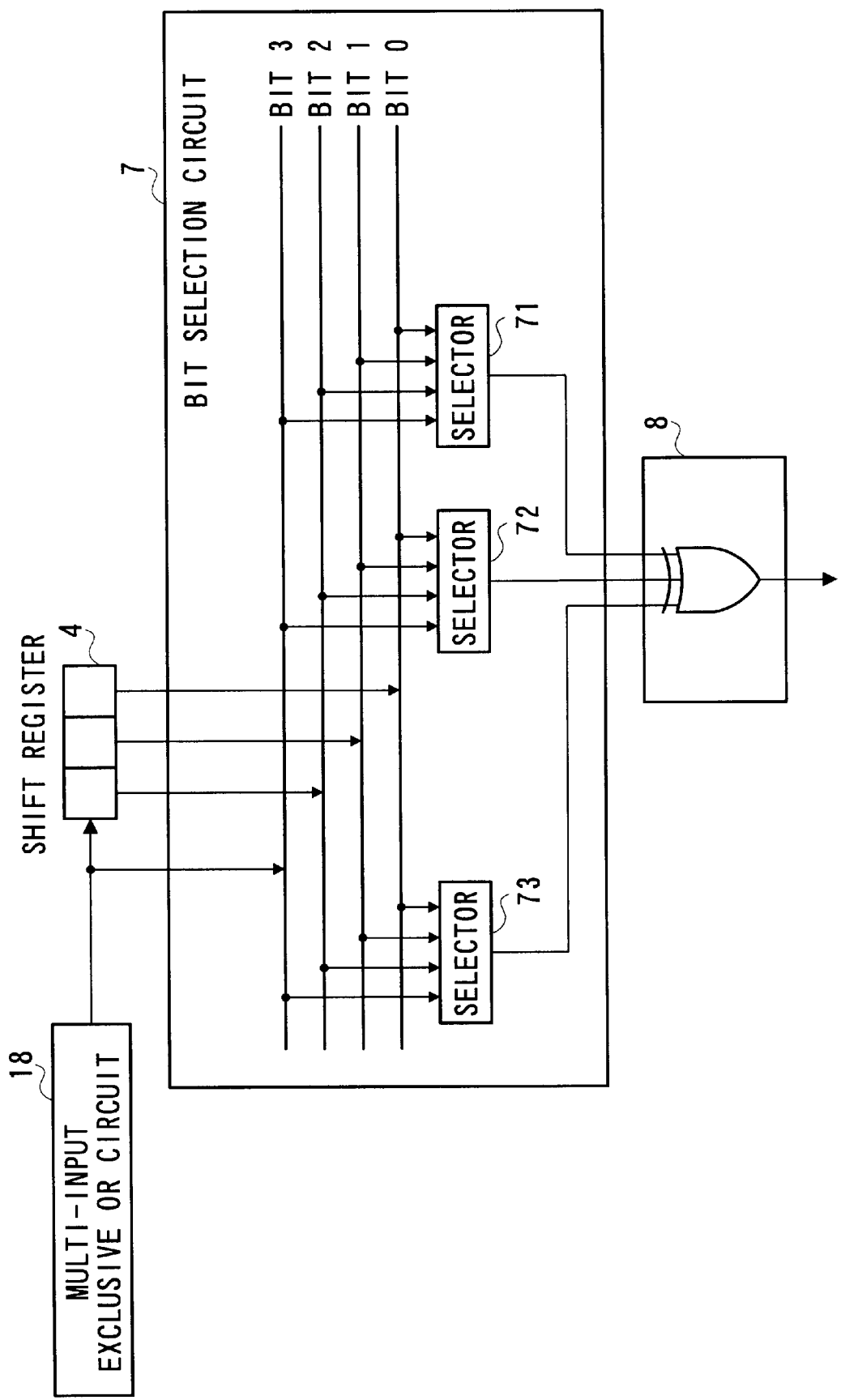
FIG. 14 is a view showing a configuration of a bit selection circuit provided in the operation processing apparatus according to the fifth embodiment of the present invention.
Figure 15:
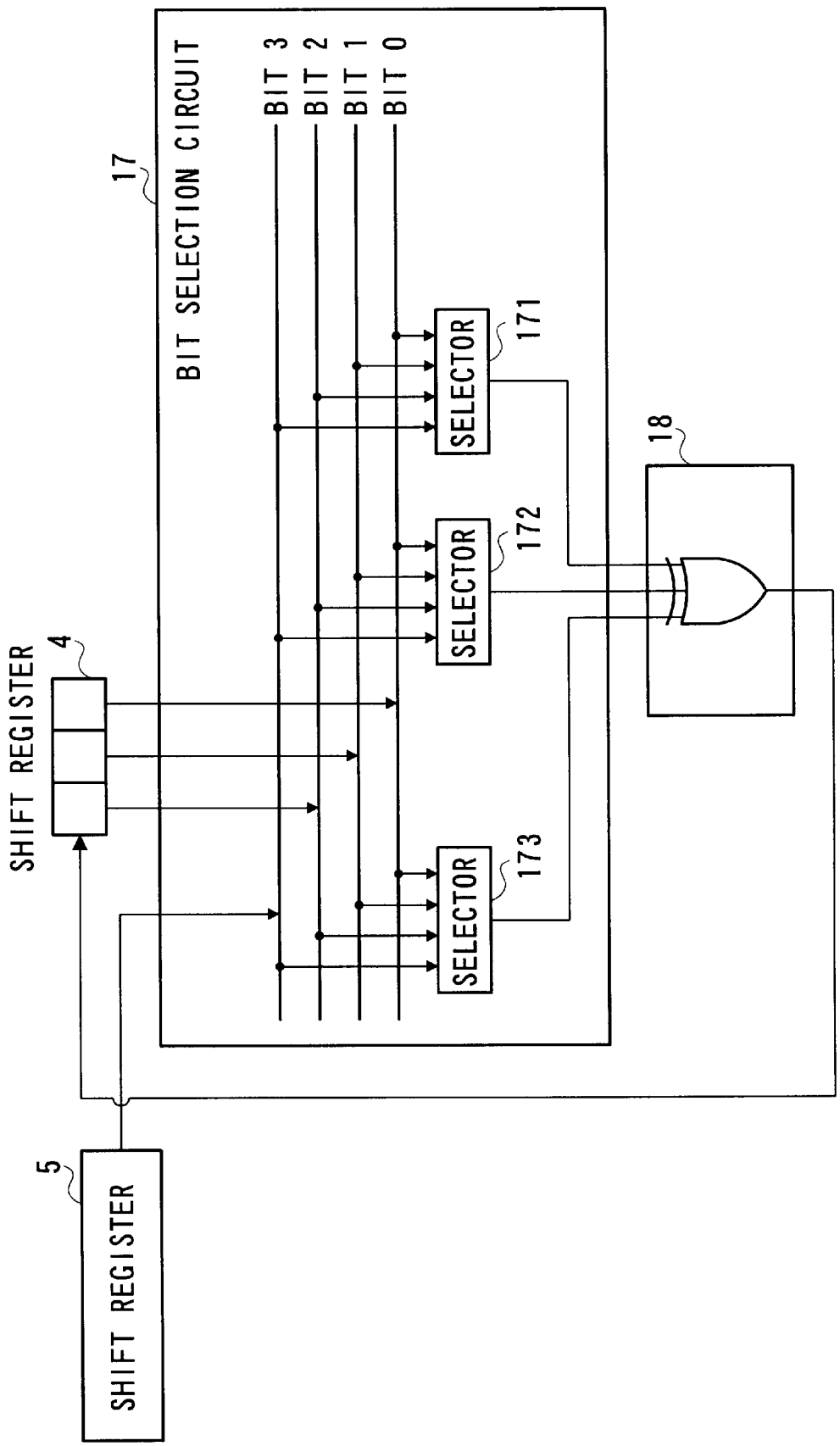
FIG. 15 is a view showing a configuration of a bit selection circuit provided in the operation processing apparatus according to the fifth embodiment of the present invention.

FIG. 14 is a view showing a configuration example of bit selection circuit 7, and FIG. 15 is a view showing a configuration example of bit selection circuit 17.

Bit selection circuit 7 comprises selectors 71 to 73. Selectors 71 to 73 have four-bit input and one-bit output, and input one bit of the output of the multi-input exclusive OR circuit 18 and three bits of the shift register 4, and output one bit to exclusive OR circuit 8.

Bit selection circuit 17 comprises selectors 171 to 173. Selectors 171 to 173 have four-bit input and one-bit output, and input one bit of the output of shift register 5 and three bits of the shift register 4, and output one bit to exclusive OR circuit 18.

An explanation will be given of an operation, which is carried out when the operation processing apparatus shown in FIGS. 13 to 15 performs turbo code processing shown in FIGS. 11, 12. In this case, it is assumed that a bit width of a data path of each of data memory 1, address counter 2 data bus 3, shift registers 5 and registers 6 and 9 is 8 bits. Also, it is assumed that a bit width of shift register 4 is 3 bits. Moreover, it is assumed that 8 bits of code target data are used as one word and stored from address 0 in order in data memory 1. Herein, just for simplification, it is assumed that one frame information data is 8 bits.

First of all, as a first step, a head address of data is set to address counter 2. Also, 0 is stored in shift register 4.

Next, as a second step, data of the address shown by counter 2 is read from data memory 1, and stored in shift register 5 through data bus 3. Also, a value of address counter 2 is incremented by one.

Next, as a third step, data b'1011' of a bit position of the shift register, which is necessary for generating encoded data X1 in FIG. 12, is stored into register 6.

Next, as a fourth step, data b'1101' of a bit position, which is necessary for generating input data of the first stage of shift register in FIG. 12, and is stored into register 16.

Next, as a fifth step, bit selection circuit 17 and multi-input exclusive OR circuit 18 operate. At this time, selectors 171 to 173 provided in the bit selection circuit 17 shown in FIG. 15 operate in accordance with bit position data retained in register 16. Namely, selectors 171 to 173 select bits "0", "2", "3", respectively, and output them to multi-input exclusive OR circuit 18. As shown in FIG. 14, the output of the multi-input exclusive OR circuit 18 is input to as bit 3 of bit selection circuit 7. At the same time, bit selection circuit 7 and multi-input exclusive OR circuit 8 operate so as to generate encoded data, and a generation result is shift input to shift register 9 and stored therein. At this time, selectors 71 to 73, which are provided in the bit selection circuit 7 shown in FIG. 14, operate in accordance with bit position data retained in register 6. In other words, selectors 71 to 73 select bits "0", "1", "3", and output them to multi-input exclusive OR circuit 8.

Next, as a sixth step, shift registers 4 and 5 shift right by one bit, simultaneously.

The execution of processing, including the first to sixth steps, makes it possible to carry out code processing corresponding to one bit of information data.

Then, the content of shift register 5 is all shifted out by repeating fifth to sixth steps eight times. Also, since encoded data of 8 bits is stored in shift register 9, a value of shift register 9 is stored in data memory 1 as the seventh step. Moreover, when the number of bits of information data is larger than 8 bits, the operation of the first step is performed so as to replenish input data.

Next, interleave is applied to information data corresponding to one frame. First, bit sequence {d1, d2, d3, d4, d5, d6, d7, d8} of information data corresponding to one frame is read from address 0 of data memory 1, and input to interleaver 20 through data bus 3. This bit sequence is stored at address 1 of data memory 1.

Finally, the bit sequence {d4, d6, d2, d8, d5, d1, d7, d3}, corresponding to one frame after interleaving, is encoded. This may be carried out by the way in which the head address of data is located at address 1 and processing, including the above first to seventh steps, is performed. At this time, the fifth step and the sixth step are repeated eight times.

Thus, the second shift register, which provides a shift input to the first shift register for supplying information data as a code target, is formed, and information data as a code target is supplied to two selection circuits as being shifted one bit by one bit, sequentially. Then, the output of the multi-input exclusive OR circuit is supplied to either one of the selection circuits, allowing turbo code processing to be effectively carried out.

This embodiment adopts the configuration in which the output of the multi-input exclusive OR circuit is directly input to the bit selection circuit. However, the present invention is not limited to the above embodiment, and it is possible to adopt the configuration in which a pipeline register, etc., is provided between the multi-input exclusive OR circuit and the bit selection circuit. Also, there is no problem even if the above-mentioned operation timing described for each step is suitably changed along the technical concept of the present invention.

(Sixth Embodiment)

A sixth embodiment is a specific form in which the number of bits, which is selected by the bit selection circuit, is flexibly hanged in code processing of turbo code.

Figure 16:
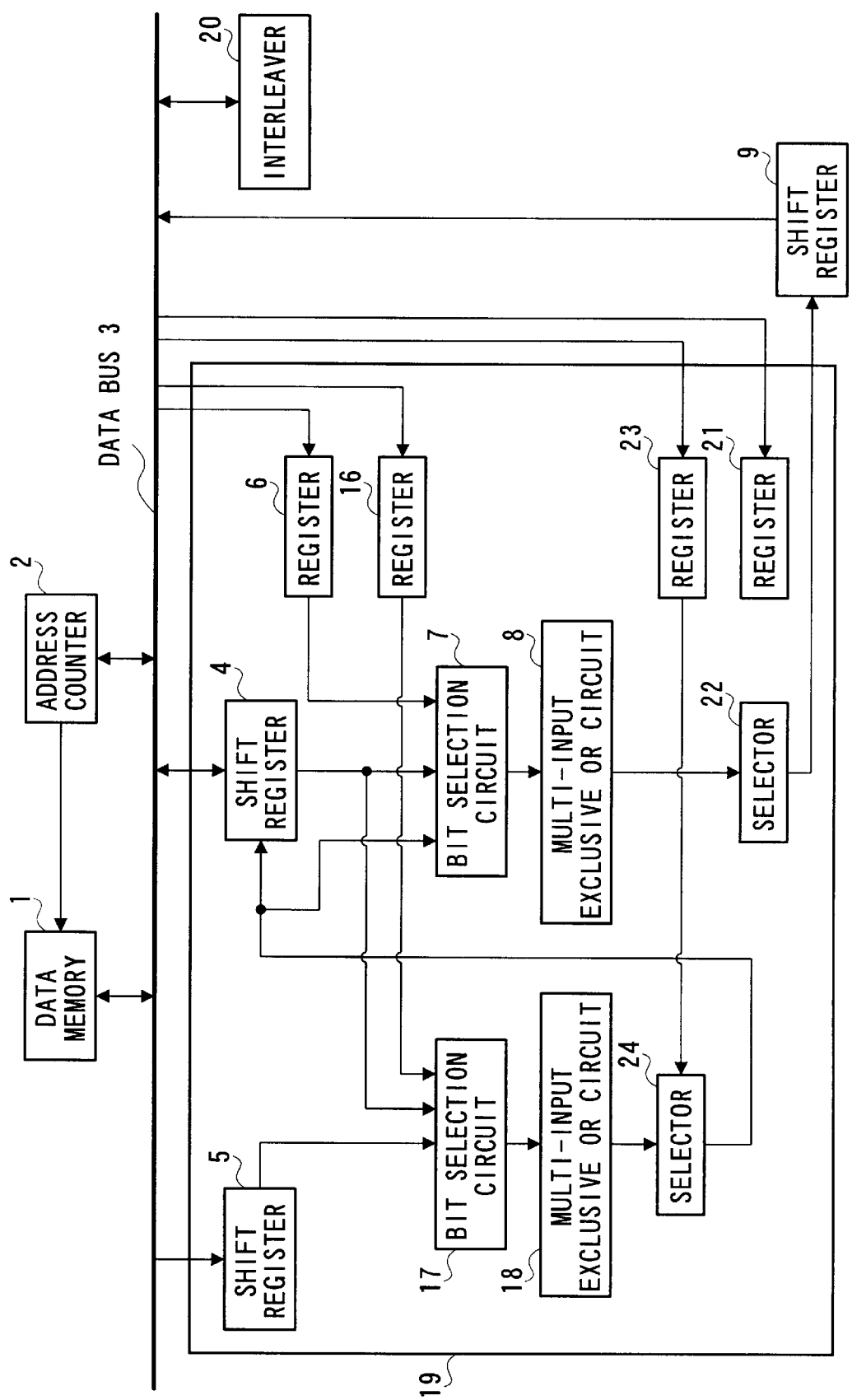
FIG. 16 is a block diagram showing a configuration of an operation processing apparatus according to a sixth embodiment.
Figure 17:
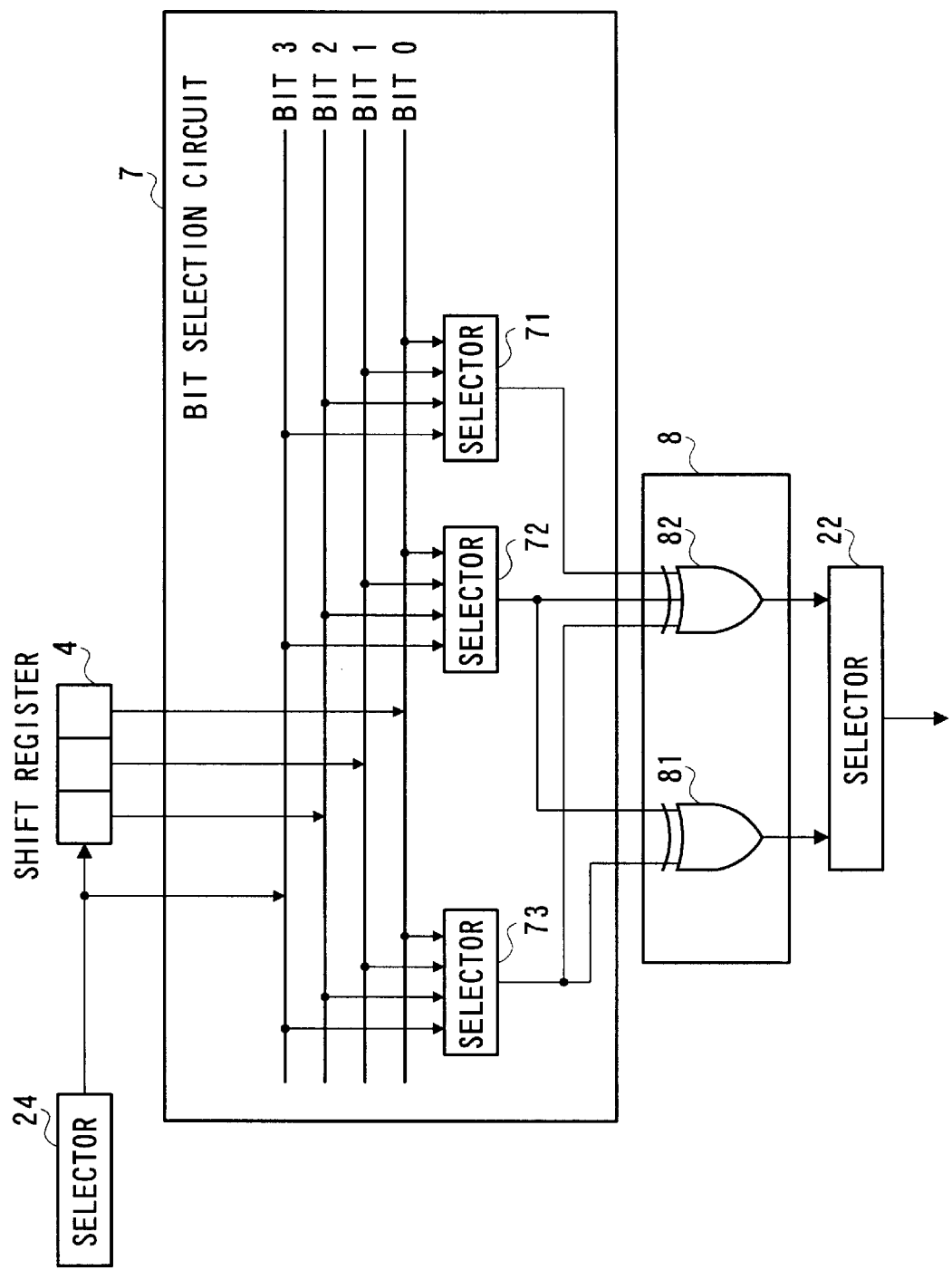
FIG. 17 is a view showing configurations of a bit selection circuit and a multi-input exclusive OR circuit provided in the operation processing apparatus according to the sixth embodiment.
Figure 18:
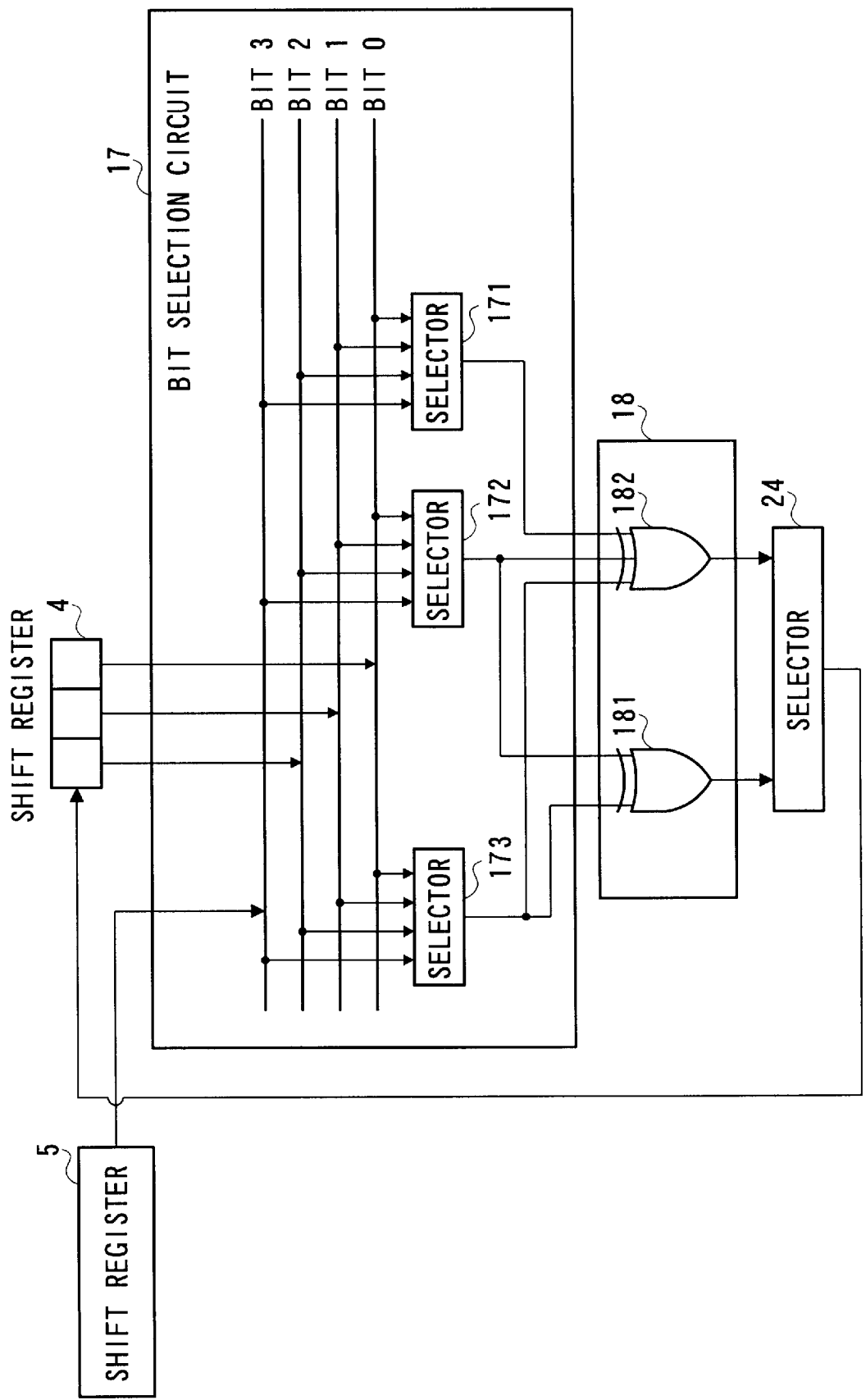
FIG. 18 is a view showing configurations of a bit selection circuit and a multi-input exclusive OR circuit provided in the operation processing apparatus according to the sixth embodiment.

FIG. 16 is a block diagram showing a configuration of the operation processing apparatus according to the sixth embodiment, and FIG. 17 is a view showing a configuration example of bit selection circuit 7 and multi-input exclusive OR circuit 8, and FIG. 18 is a view showing a configuration example of bit selection circuit 17 and multi-input exclusive OR circuit 18. In the operation processing apparatus shown in FIGS. 16 to 18, the same reference numerals as those of FIGS. 13 to 15 are added to the configuration portions common to those of FIGS. 13 to 15, and the explanation will be omitted.

The operation processing apparatus of FIG. 16 adopts a configuration in which registers 21, 23, and selectors 22, 24 are added to the operation processing apparatus of FIG. 13.

Also, as shown in FIG. 17, multi-input exclusive OR circuit 8 comprises two multi-input exclusive OR circuits having a different number of input bits. In other words, multi-input exclusive OR circuit 8 comprises multi-input exclusive OR circuit 81 with two inputs and multi-input exclusive OR circuit 82 with three inputs.

Register 21 retains information showing by which one of two exclusive OR circuits 81 and 82 exclusive OR operation is performed.

Register 22 is connected to exclusive OR circuits 81 and 82 at an input side, and connected to shift register 9 at an output side. Then, selector 22 selects an exclusive OR circuit to be used in accordance with information output from register 21.

Also, as shown in FIG. 18, multi-input exclusive OR circuit 18 comprises two multi-input exclusive OR circuits having a different number of input bits. In other words, multi-input exclusive OR circuit 18 comprises multi-input exclusive OR circuit 181 with two inputs and multi-input exclusive OR circuit 182 with three inputs.

Register 23 retains information showing by which one of two exclusive OR circuits 181 and 182 exclusive OR operation is performed.

Selector 24 is connected to exclusive OR circuits 181 and 182 at an input side, and connected to shift register 9 at an output side. Then, selector 24 selects an exclusive OR circuit to be used in accordance with information output from register 23.

Next, an explanation will be given of an operation, which is carried out when the operation processing apparatus shown in FIGS. 16 to 18 performs processing equivalent to the turbo encoder having a different number of bits as a target of exclusive OR operation in two exclusive OR circuit provided in RSC shown in FIG. 19. In this case, it is assumed that a bit width of a data path of each of data memory 1, address counter 2 data bus 3, shift registers 5 and registers 6 and 9 is 8 bits. Also, it is assumed that a bit width of shift register 4 is 3 bits. Moreover, it is assumed that 8 bits of code target data are used as one word and stored from address 0 in order.

First of all, as a first step, a head address of data is set to address counter 2. Also, 0 is stored in shift register 4.

Next, as a second step, data of the address shown by counter 2 is read from data memory 1, and stored in shift register 5 through data bus 3. Also, a value of address counter 2 is incremented by one.

Figure 19:
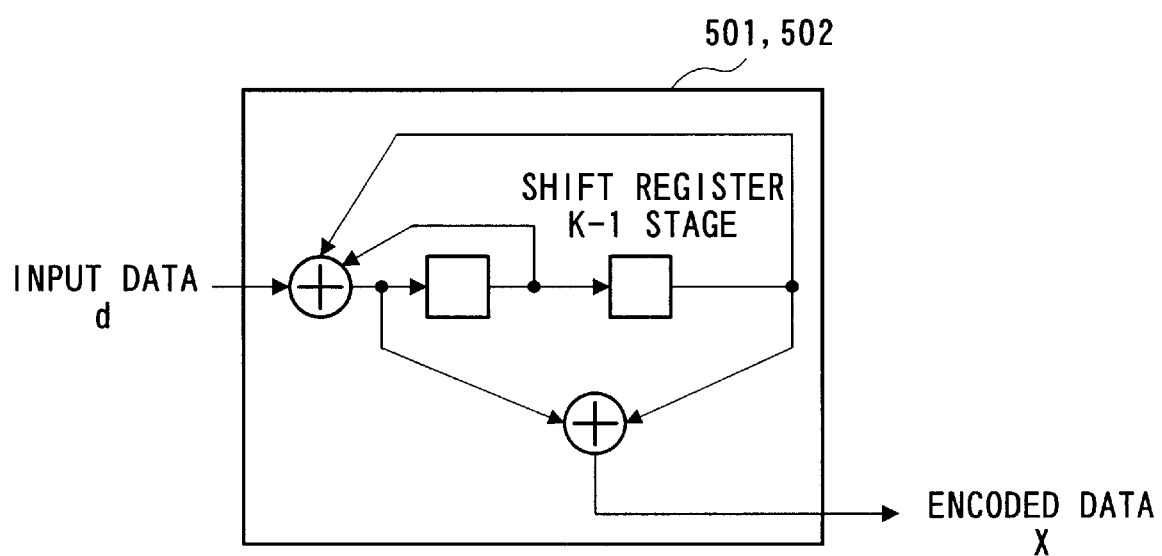
FIG. 19 is a view illustrating a capability of a recursive organization convolutional encoder configuring the turbo encoder.

Next, as a third step, data b'1010' of a bit position of the shift register, which is necessary for generating encoded data X1 in FIG. 19, is stored into register 6.

Next, as a fourth step, data b'1110' of a bit position, which is necessary for generating input data of the first stage of shift register in FIG. 19, and is stored into register 16.

Next, as a fifth step, bit number 3, which inputs to the exclusive OR to generate input data of the first stage of shift register in FIG. 19, is stored to register 23.

Next, as a sixth step, bit selection circuit 17 and multi-input exclusive OR circuit 18 operate to output the result to bit selection circuit 7 through selector 24. At this time, selectors 171 to 173 of bit selection circuit 17 shown in FIG. 18 operate in accordance with bit position data retained in register 16. Namely, selectors 171 to 173 select bits "1", "2", "3" and output them to exclusive OR circuit 182 of multi-input exclusive OR circuit 18. Selector 24 selects an output of exclusive OR circuit 182 and outputs it in accordance with information stored in register 23.

As shown in FIG. 17, the output of selector 24 is input as bit 3 of bit selection circuit 7. Bit selection circuit 7 and multi-input exclusive OR circuit 8 operate so as to generate encoded data, and shift input the generation result to shift register 9 through selector 22 to be stored therein. At this time, selectors 71 to 73 of bit selection circuit 7 operate in accordance with bit position data retained in register 6. Namely, selector 71 does not operate, and selectors 72 and 73 select bits "1" and "3", respectively, and output them to exclusive OR circuit 81 of multi-input exclusive OR circuit 8. Selector 22 selects an output of exclusive OR circuit 81 and shift inputs it to shift register 9 in accordance with information stored in register 21.

Next, as an eighth step, shift registers 4 and 5 shift right by one bit simultaneously.

The execution of processing, including first to eighth steps, makes it possible to carry out code processing corresponding to one bit of information data.

Then, the content of shift register 5 is all shifted out by repeating seventh to eighth steps eight times. Also, since encoded data of 8 bits is stored in shift register 9, a value of shift register 9 is stored in data memory 1 as a ninth step. Moreover, when the number of bits of information data is larger than 8 bits, the operation of the firth step is performed so as to replenish input data.

Next, interleave is applied to information data corresponding to one frame. First, bit sequence {d1, d2, d3, d4, d5, d6, d7, d8} of information data corresponding to one frame is read from address 0 of data memory 1, and input to interleaver 20 through data bus 3. This bit sequence is stored at address 1 of data memory 1.

Finally, the bit sequence {d4, d6, d2, d8, d5, d1, d7, d3}, corresponding to one frame after interleaving, is encoded. This may be carried out by the way in which the head address of data is located at address 1 and processing, including the above first to seventh steps, is performed. At this time, the fifth step and the sixth step are repeated eight times.

Thus, a plurality of exclusive OR circuits having a different input is prepared, and an exclusive OR circuit is appropriately selected in accordance with the number of bits as an operation target. This makes it possible to flexibly deal with a case of performing processing equivalent to the turbo encoder having a different bit number as an operation target of exclusive OR operation in two exclusive OR circuits provided in RSC.

(Seventh Embodiment)

A seventh embodiment is a specific form in which a number of wiring of bit selection circuit in the operation processing apparatus is reduced to lessen an area of a wiring region at the time of forming LSI.

Figure 20:
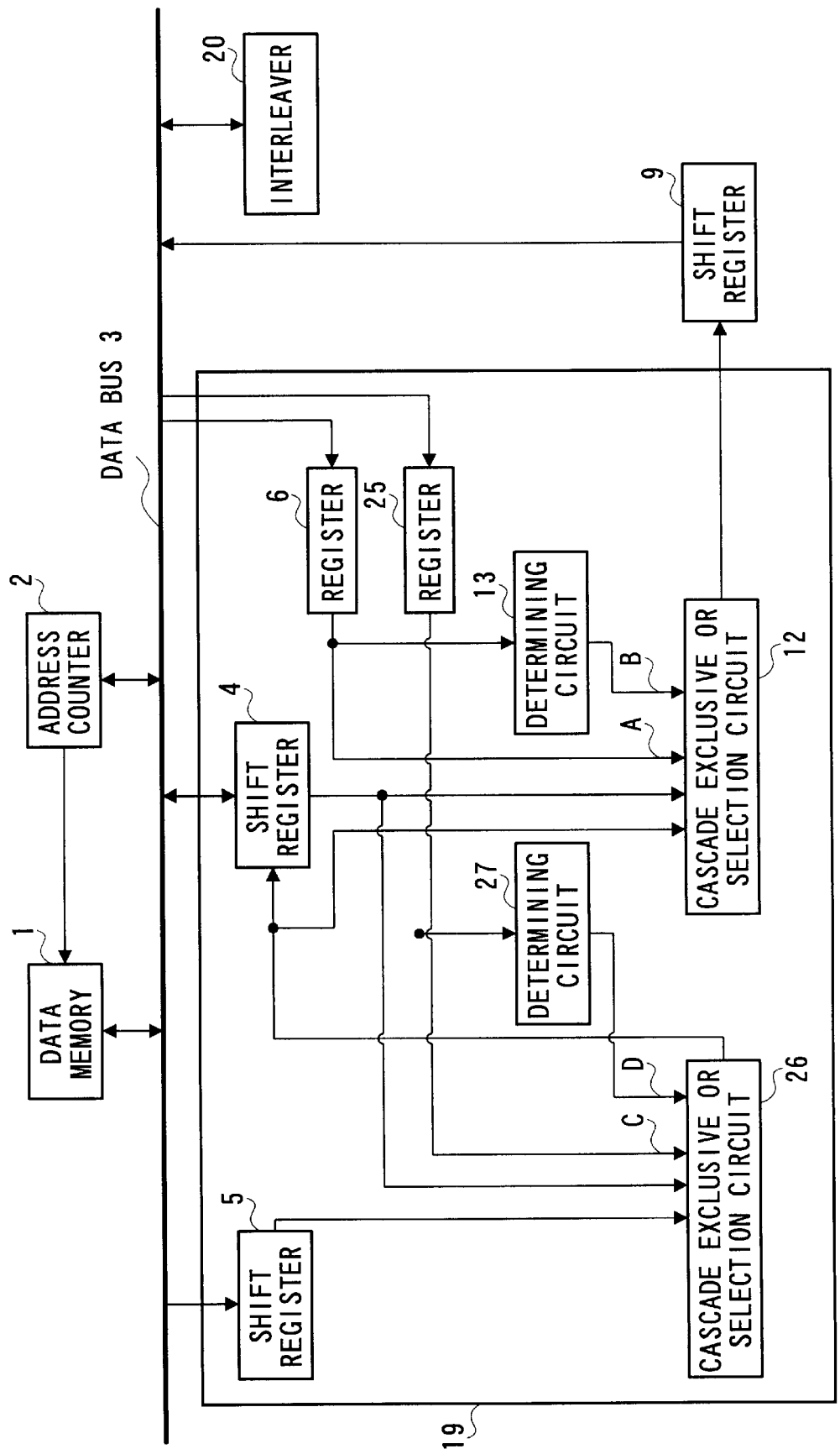
FIG. 20 is a block diagram showing a configuration of an operation processing apparatus according to a seventh embodiment.

FIG. 20 is a block diagram showing a configuration of an operation processing apparatus according to the seventh embodiment. In the operation processing apparatus shown in FIG. 20, the same reference numerals as those of FIG. 13 are added to configuration portions common to the apparatus shown in FIG. 13, and the explanation will be omitted.

As compared with the operation processing apparatus of FIG. 13, the operation processing apparatus of FIG. 20 adopts the configuration in which cascade exclusive OR circuits 12, 26 and determining circuits 13, 27 are added in place of bit selection circuit 7, 17 and multi-input exclusive OR circuit 8, 18.

Figure 21:
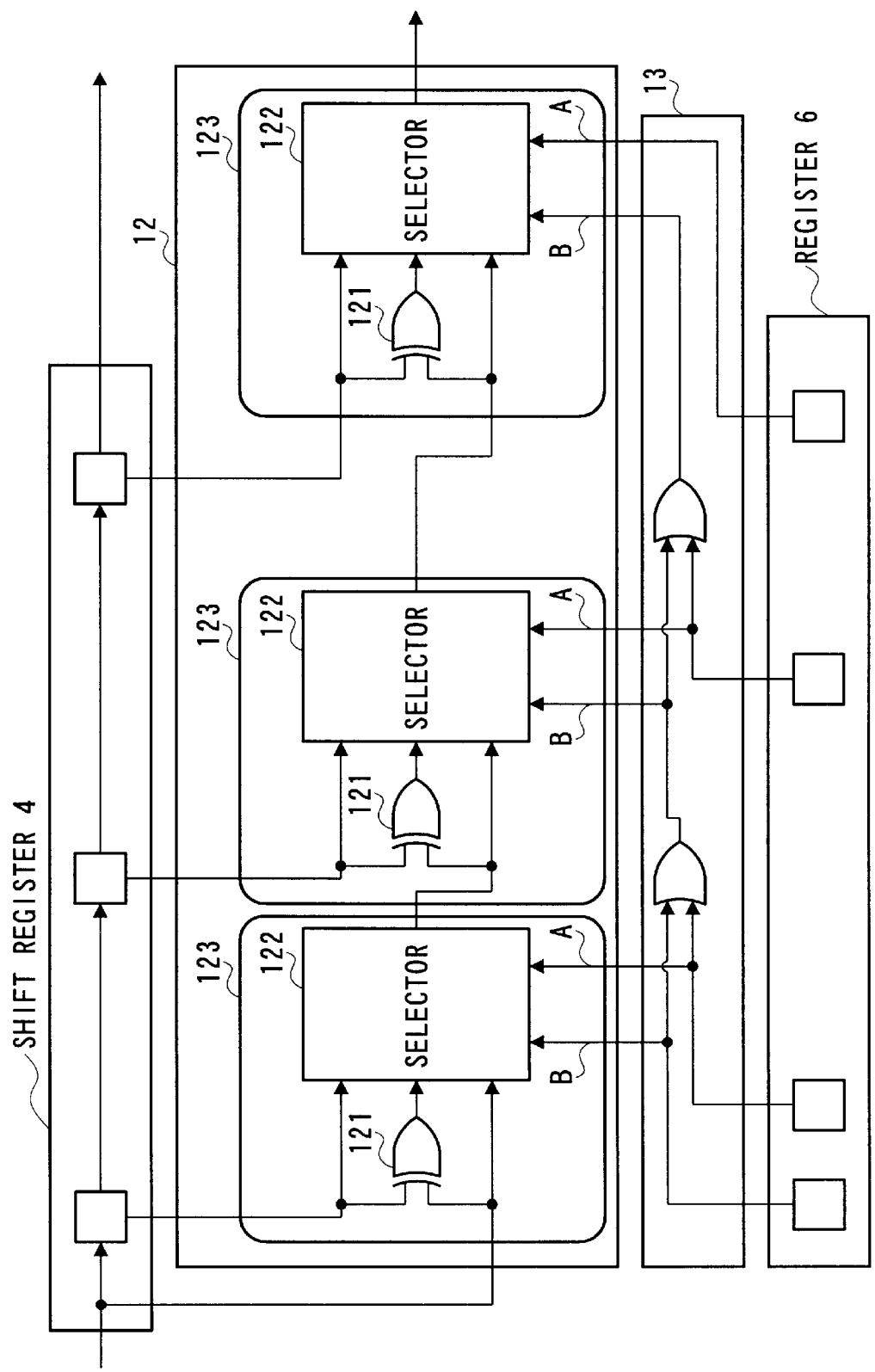
FIG. 21 is a view showing configurations of a cascade exclusive OR selection circuit and a determination circuit provided in the operation processing apparatus according to the seventh embodiment.

FIG. 21 is a view showing a configuration example of cascade exclusive OR selection circuit 12 according to the seventh embodiment. As shown in FIG. 21, cascade exclusive OR selection circuit 12 configures one unit having exclusive OR circuit 121 with two inputs and one output and selector 122. Hereinafter, one unit having exclusive OR circuit 121 and selector 122 is referred to as "configuration unit 123".

The number of configuration units 123 is equal to n, the number of stages of shift register 4. If the number of stages of shift register 4 is 3, the number of configuration units 123 is 3.

Register 6 is connected to determining circuit 13 and selector 122 of each configuration unit 123, and outputs bit selective information. Bit selective information is used as control signal A, which designates a bit position of target data of exclusive OR operation and which instructs whether or not a bit of i-th stage of shift register 4 is used as an input of exclusive OR circuit 121 of i-th stage, simultaneously (i is a natural number of less than or equal to n).

Determining circuit 13 is connected to selector 122 of each configuration unit 123, and outputs a control signal B. Control signal B is a signal, which determines whether or not a bit, which is present before i-th stage of shift register 4, is used as an input of exclusive OR circuit 121 of i-th stage.

Exclusive OR circuit 121 of the first stage inputs a bit output of cascade exclusive OR selection circuit 26 and a bit output of the first stage of shift register 4. Also, exclusive OR circuit 121 of i-th stage other than the first stage inputs a bit output of of selector 122 of (i−1)th stage and a bit output of i-th stage of shift register 4.

Selector 122 of the first stage uses a bit output of the first stage of shift register 4 as first input data, and uses a bit output of exclusive OR circuit 121 of the first stage as second input data, and uses a bit output of exclusive OR selection circuit 26 as third input data. Also, selector 122 of i-th stage other than the first stage uses a bit output of ith stage of shift register 4 as first input data, uses a bit output of exclusive OR circuit 121 of i-th as second input data, and uses a bit output of selector 122 of (i−1) th stage as third input data. Then, each selector outputs any one of first input data to third input data in accordance with values of control signal A and control signal B.

By this connectional relationship, n configuration units 123 are connected in a multi-stage cascade manner in the cascade exclusive OR selection circuit 12. The output of exclusive OR selection circuit 12 is shift input to shift register 9.

Figure 22:
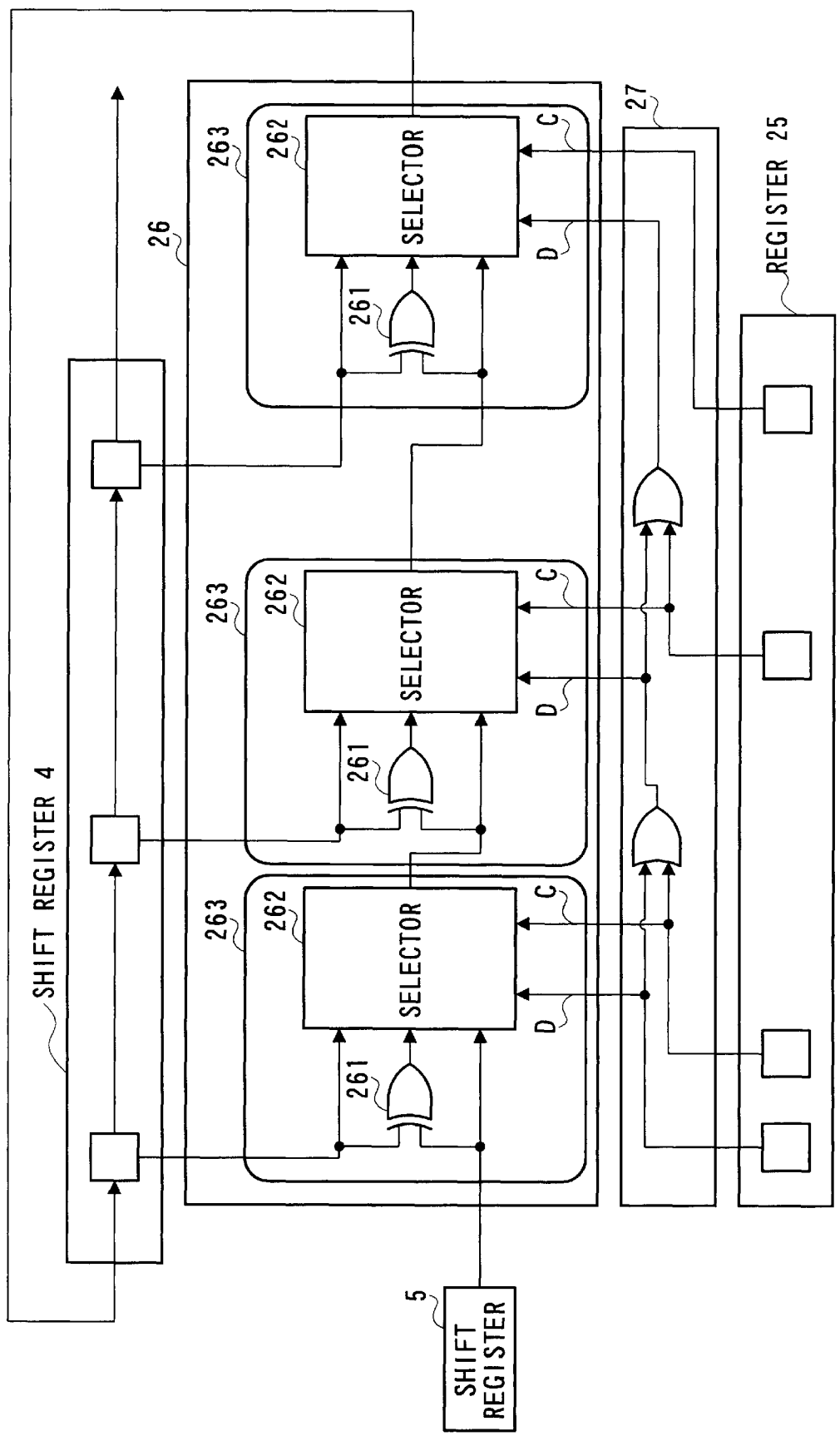
FIG. 22 is a view showing configurations of a cascade exclusive OR selection circuit and a determination circuit provided in the operation processing apparatus according to the seventh embodiment.

FIG. 22 is a view showing a configuration example of cascade exclusive OR selection circuit 26 according to the seventh embodiment. As shown in FIG. 22, cascade exclusive OR selection circuit 26 configures one unit having exclusive OR circuit 261 with two inputs and one output and selector 262. Hereinafter, one unit having exclusive OR circuit 261 and selector 262 is referred to as "configuration unit 263".

The number of configuration units 263 is equal to n, the number of stages of shift register 4. If the number of stages of shift register 4 is 3, the number of configuration units 263 is 3.

Register 25 is connected to determining circuit 27 and selector 262 of each configuration unit 263, and outputs bit selective information. Bit selective information is used as control signal C, which designates a bit position of target data of exclusive OR operation and which instructs whether or not a bit of i-th stage of shift register 4 is used as an input of exclusive OR circuit 261 of i-th stage, simultaneously (i is a natural number of less than or equal to n).

Determining circuit 27 is connected to selector 262 of each configuration unit 263, and outputs a control signal D. Control signal D is a signal, which determines whether or not a bit, which is present before i-th stage of shift register 4, is used as an input of exclusive OR circuit 261 of i-th stage.

Exclusive OR circuit 261 of the first stage inputs a bit output of shift register 5 and a bit output of the first stage of shift register 4. Also, exclusive OR circuit 261 of i-th stage other than the first stage inputs a bit output of selector 262 of (i−1) th stage and a bit output of i-th stage of shift register 4.

Selector 262 of the first stage uses a bit output of the first stage of shift register 4 as first input data, and uses a bit output of exclusive OR circuit 261 of the first stage as second input data, and uses a bit output of shift register 5 as third input data. Also, selector 262 of i-th stage other than the first stage uses a bit output of ith stage of shift register 4 as first input data, uses a bit output of exclusive OR circuit 261 of i-th as second input data, and uses a bit output of selector 262 of (i−1) th stage as third input data.

Figure 9:
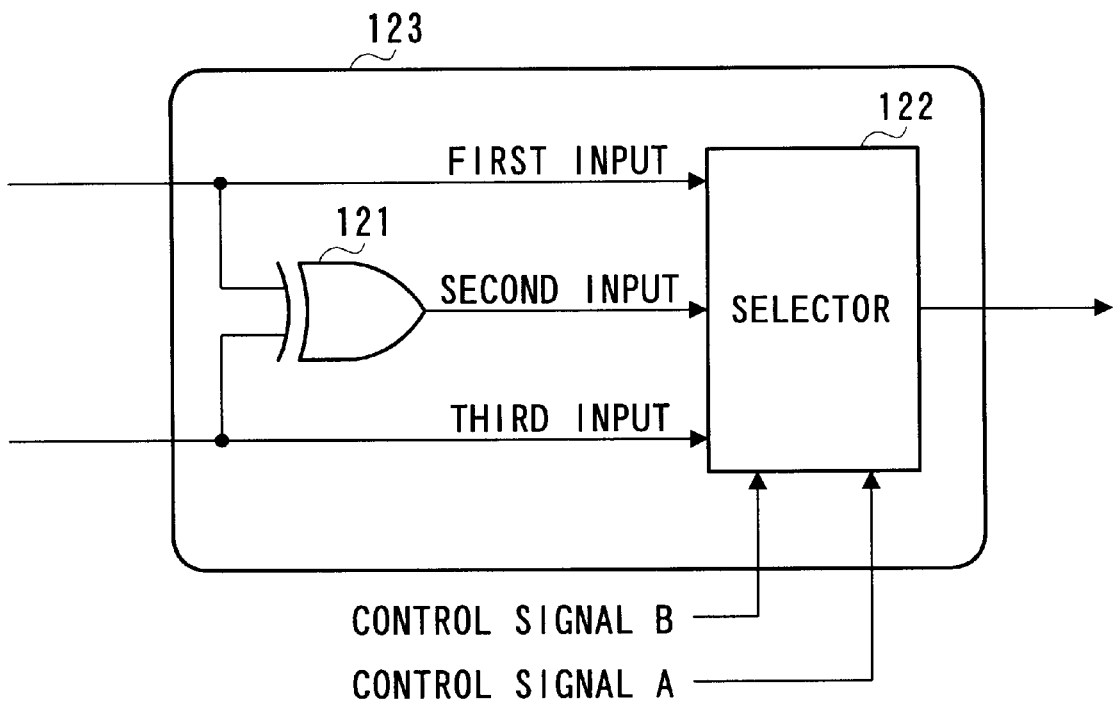
FIG. 9 is a view explaining an operation of a configuration unit configuring the cascade exclusive OR selection circuit provided in the operation processing apparatus according to the third embodiment.

Then, each selector outputs any one of first input data to third input data in accordance with values of control signal C and control signal D. The specific operation of selector 262 is similar to that of selector 122 shown in FIG. 9 wherein control signal A and control signal B in FIG. 9 are replaced with control signal C and control signal D.

By this connectional relationship, n configuration units 263 are connected in a multi-stage cascade manner in the cascade exclusive OR selection circuit 26. The output of cascade exclusive OR selection circuit 26 is input to shift register 4 and cascade exclusive OR selection circuit 12.

Next, an explanation will be given of an operation, which is carried out when the above operation processing apparatus performs processing of the turbo encoder shown in FIGS. 11 and 19.

In this case, it is assumed that a bit width of a data path of each of data memory 1, address counter 2 data bus 3, shift registers 5 and registers 6, 7 and 13 is 8 bits. Also, it is assumed that the number of bits shift register 4 is 3 bits. Moreover, it is assumed that 8 bits of code target data are used as one word and stored in data memory 1 from address 0 in order. Herein, just for simplification, it is assumed that information data of one frame is 8 bits.

First of all, as a first step, a head address of data is set to address counter 2. Also, 0 is stored in shift register 4.

Next, as a second step, data of the address shown by counter 2 is read from data memory 1, and stored in shift register 5 through data bus 3. Also, a value of address counter 2 is incremented by one.

Next, as a third step, data b'1010' of a bit position of the shift register, which is necessary for generating encoded data x in FIG. 19, is stored into register 6.

Next, as a fourth step, data b'1110' of a bit position, which is necessary for generating input data of the first stage of shift register in FIG. 19, and is stored into register 16.

Next, as a fifth step, cascade exclusive OR selection circuit 26 operates to generate encoded data, and outputs the generation result to the shift register 4 and cascade exclusive selection circuit 12. At this time, each configuration unit 263 of cascade exclusive OR selection circuit 26 performs the select operation similar to FIG. 9 based on control signals C and D. Also, cascade exclusive OR selection circuit 12 operates to generate encoded data, and outputs the generation result to the shift register 9. At this time, each selector 122 of cascade exclusive selection circuit 12 performs the select operation shown in FIG. 9 based on control signals A and B.

Next, as a sixth step, shift registers 4 and 5 shift right by one bit simultaneously.

The execution of processing, including first to sixth steps, makes it possible to carry out code processing corresponding to one bit of information data.

Then, the content of shift register 5 is all shifted out by repeating fifth to sixth steps eight times. Also, since encoded data of 8 bits is stored in shift register 9, a value of shift register 9 is stored in data memory 1 as the seventh step. Moreover, when the number of bits of information data is larger than 8 bits, the operation of the first step is performed so as to replenish input data.

By the aforementioned processing, code processing using RSC with respect to information data, corresponding to one frame, is ended.

Next, interleave is applied to information data corresponding to one frame. First, bit sequence {d1, d2, d3, d4, d5, d6, d7, d8} of information data corresponding to one frame is read from address 0 of data memory 1, and input to interleaver 14 through data bus 3. Interleaver 14 outputs bit sequence {d4, d6, d2, d8, d5, d1, d7, d3}. This bit sequence is stored at address 1 of data memory 1.

Finally, the bit sequence {d4, d6, d2, d8, d5, d1, d7, d3}, corresponding to one frame after interleaving, is encoded. This may be carried out by the way in which the head address of data is located at address 1 and processing, including the above first to seventh steps, is performed. At this time, the fifth step and the sixth step are repeated eight times.

Thus, the use of the cascade exclusive OR selection circuit eliminates the need for the step for storing the number of information bits in the register, which is needed in the sixth embodiment. As a result, turbo code processing can be performed at higher speed than the sixth embodiment.

Also, as is obvious from the comparison between FIGS. 21, 22 and 17, 18, since the operating processing apparatus of the seventh embodiment can simplify the wire structure so as to an amount of wiring as maintaining a capability equivalent to the operating processing apparatus of the sixth embodiment, an area of a wiring region can be reduced at the time of forming LSI.

Also, even if the number of bits as a target of exclusive OR operation is different in two exclusive OR circuits of RSC, turbo code processing can be effectively carried out.

(Eighth Embodiment)

An eighth embodiment is a specific form in which both turbo code processing and convolutional code processing can be executed by one operation processing apparatus.

Figure 23:
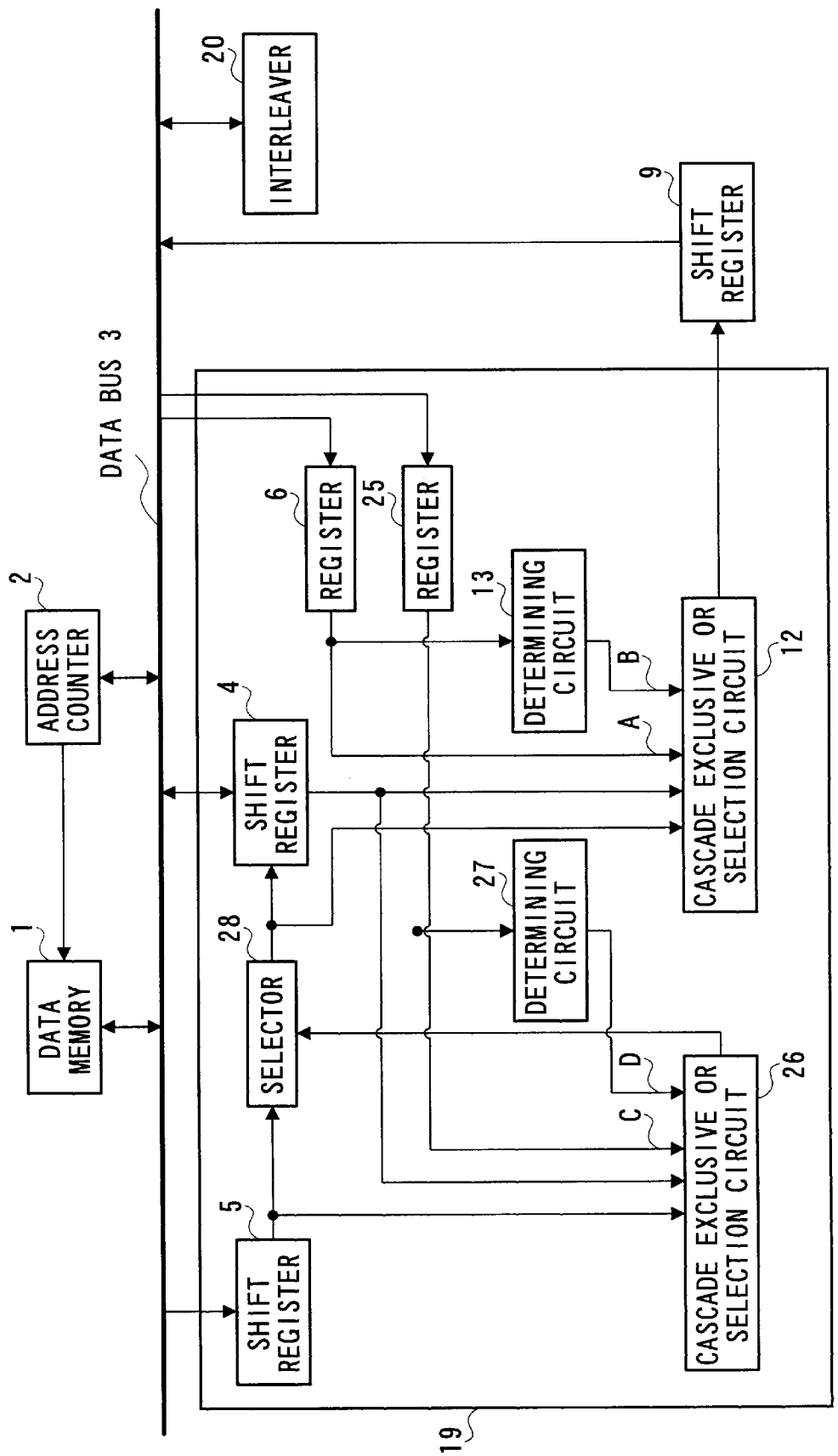
FIG. 23 is a block diagram showing a configuration of an operation processing apparatus according to an eighth embodiment.

FIG. 23 is a block diagram showing a configuration of an operation processing apparatus according to the eighth embodiment. In the operation processing apparatus shown in FIG. 23, the same reference numerals as those of FIG. 20 are added to the configuration portions common to FIG. 20, and the explanation will be omitted.

The operation processing apparatus shown in FIG. 23 adopts a configuration in which selector 28 is added as compared with the operation processing apparatus shown in FIG. 20.

A shift output of shift register 5 is input to cascade exclusive OR selection circuit 26 and selector 28. An output of cascade exclusive OR selection circuit 26 is input to selector 28.

Selector 28 selects either one of the output of cascade exclusive OR selection circuit 26 and that of shift register 5, and outputs it to shift register 4 and exclusive OR selection circuit 12.

If selector 28 selects the output of cascade exclusive OR selection circuit 26, the operation processing apparatus of FIG. 23 has completely the same configuration as that of FIG. 20 in view of the capability, and turbo code processing can be carried out in the steps as shown in the seventh embodiment.

Figure 24:
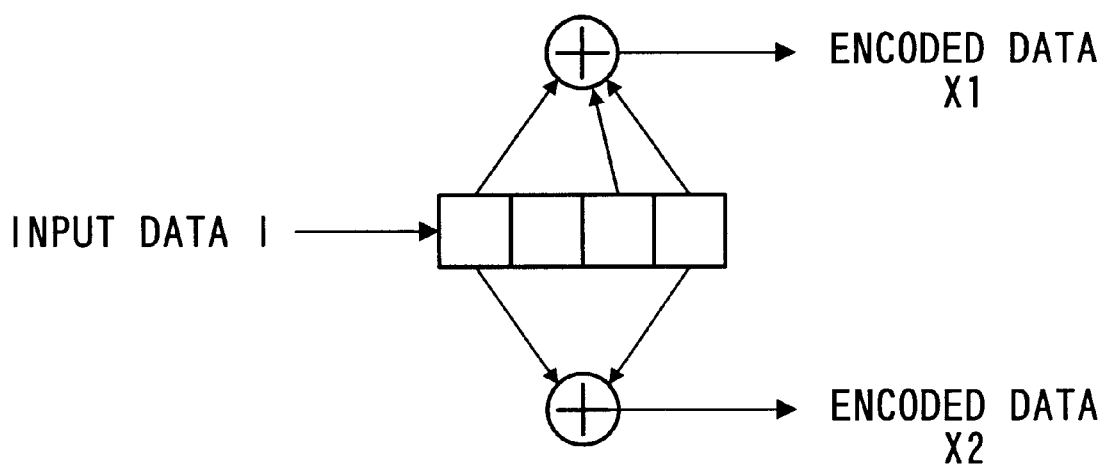
FIG. 24 is a view illustrating a capability of a convolutional encoder.

While, if selector 28 selects the output of shift register 5, it is possible to carry out convolutional code processing shown in FIG. 24. Hereinafter, an explanation will be given of an operation, which is carried out when the operation processing apparatus of FIG. 23 performs processing equivalent to the convolutional encoder with a constraint length of K=4 and a coding rate of 1/2.

In this case, it is assumed that a bit width of a data path of each of data memory 1, address counter 2, data bus 3, shift register 5 and registers 6, 7 and 13 is 8 bits. Also, it is assumed that 8 bits of code target data are used as one word and stored in data memory 1 from address 0 in order. Herein, just for simplification, it is assumed that information data of one frame is 8 bits. And, data b'0000' is stored in register 25 beforehand.

First of all, as a first step, a head address 0 of data is set to address counter 2.

Next, as a second step, data of the address shown by counter 2 is read from data memory 1, and stored in shift register 4 through data bus 3. Also, a value of address counter 2 is incremented by one.

Next, as a third step, data of the address shown by counter 2 is read from data memory 1, and stored in shift register 5 through data bus 3.

Next, as a fourth step, data b'1011' of a bit position of the shift register, which is necessary for generating encoded data X1 in FIG. 24, is stored into register 6.

Next, as a fifth step, cascade exclusive OR selection circuit 12 operates to generate encoded data, and outputs the generation result to the shift register 9. At this time, each selector 122 of cascade exclusive OR selection circuit 12 performs the select operation shown in FIG. 9 based on control signals A and B.

Next, as a sixth step, data b'1001' of a bit position of the shift register, which is necessary for generating encoded data X1 in FIG. 24, is stored into register 6.

Next, as a seventh step, cascade exclusive OR selection circuit 12 operates to generate encoded data, and outputs the generation result to the shift register 9. At this time, each selector 122 of cascade exclusive OR selection circuit 12 performs the select operation shown in FIG. 9 based on control signals A and B.

Next, as an eighth step, shift registers 4 and 5 shift right by one bit, simultaneously.

The execution of processing, including first to eighth steps, makes it possible to carry out code processing corresponding to one bit of information data.

Then, the content of shift register 5 is all shifted out by repeating fourth to eighth steps four times. Also, since encoded data of 8 bits is stored in shift register 13, a value of shift register 13 is stored in data memory 1 as a ninth step.

Moreover, since the content of shift register 5 is all shifted out by further repeating fourth to eighth steps four times, namely, eight times in all, the operation of the third step is performed so as to replenish input data.

Thus, the addition of selector 28 allows both turbo code processing and convolutional code processing to be carried out by one operation processing apparatus.

Also, even when the number of bits as a target of the exclusive OR operation varies by encoded data X1 and X2, convolutional code processing can be effectively performed.

Moreover, since the wiring structure is simple, and the amount of wiring is small, an area of a wiring region can be reduced at the time of forming LSI, and reduction in cost can be improved.

(Ninth Embodiment)

A ninth embodiment is a specific form relating to an operation processing apparatus, which can perform turbo code processing at higher speed.

Figure 25:
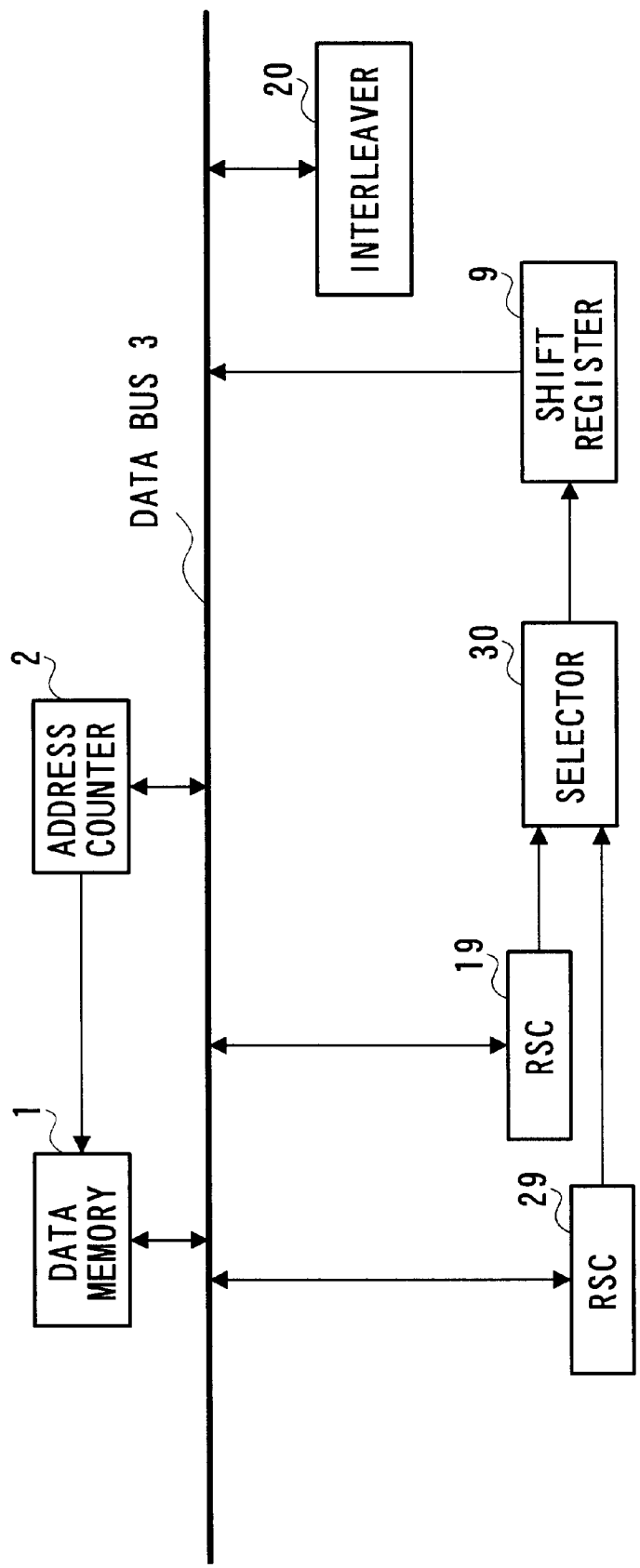
FIG. 25 is a block diagram showing a configuration of an operation processing apparatus according to a ninth embodiment.

FIG. 25 is a block diagram showing a configuration of an operation processing apparatus according to the ninth embodiment. RSC 19, which is shown in any one of FIGS. 13, 16, 20, 23, may be used. Also, RSC 29 has the same configuration as that of RSC 19. Selector 30 selects either one of the output of RSC 19 and that of RSC 29, and outputs it to shift register 9.

The following will explain an operation, which is carried out when the operation processing apparatus of FIG. 25 performs turbo code processing. First of all, information data is read from data memory 1, read information data is input to interleaver 20, and interleave is carried out. Data whose bit position is converted after interleaving is stored into data memory 1 again. It is assumed that 0 is prestored in shift register 4 of RSC 19 and that of RSC 29.

Next, information data is read from data memory 1, and read information data is stored in shift register 5 of RSC 29.

RSC 19 and RSC 29 operate in parallel. The operation is performed in the steps described in any one of fifth to eighth embodiments, encoded data is output one bit by one bit. Selector 30 selects encoded data output from RSC 19 and RSC 29 alternately, and shift inputs data to shift register 9. Every time when encoded data is stored to shift register 9 by 8 bits, data of shift register 9 is stored to data memory 1.

Then, the aforementioned operation is repeated until code processing of information data corresponding to one frame is ended.

Thus, since the parallel operation of RSC 19 and RSC 29 makes it possible to perform code processing of information data and interleaved information data, turbo code processing can be carried out at high speed. Also, since selector 30 selects information data and interleaved information data one bit by one bit alternately and stores data in shift register 9, encoded data of the turbo encoder can be efficiently prepared.

(Tenth Embodiment)

A tenth embodiment is a specific form in which power consumption is largely reduced in convolutional code processing and turbo code processing.

Figure 26:
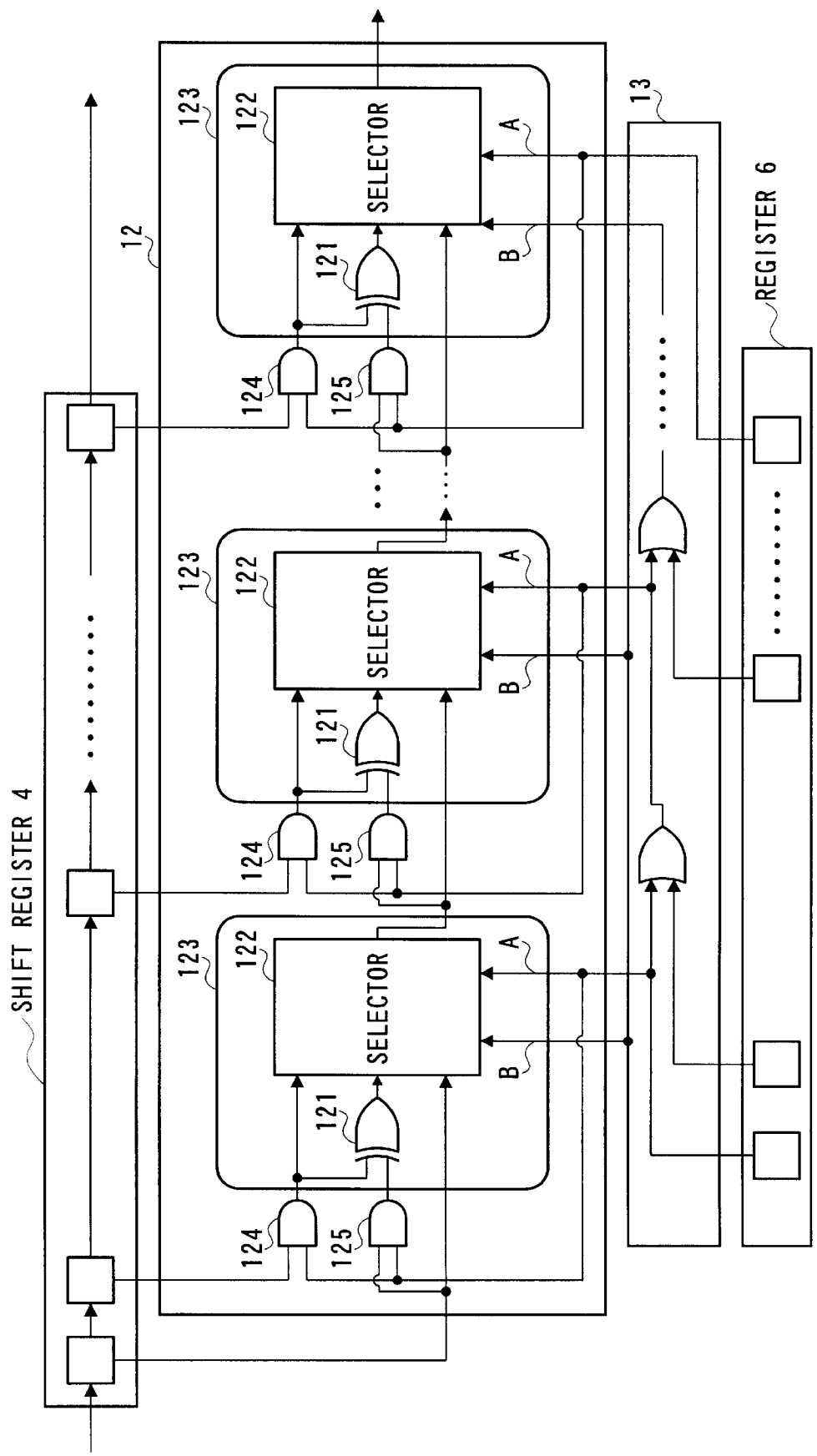
FIG. 26 is a view showing configurations of a cascade exclusive OR selection circuit and a determination circuit provided in the operation processing apparatus according to a tenth embodiment.

FIG. 26 is a view showing a configuration example of cascade exclusive OR selection circuit 12 according to the tenth embodiment. In the cascade exclusive OR selection circuit shown in FIG. 26, the same reference numerals as those of FIG. 8 are added to configuration portions common to FIG. 8, and the explanation will be omitted.

Cascade exclusive OR selection circuit 12 of FIG. 26 adopts a configuration in which AND circuits 124 and 125 are added as compared with FIG. 8.

AND circuit 124 of i-th stage inputs a value of (i+1) stage of shift register 4 and a value of (i+1) stage of shift register 6, and outputs a result of AND operation. Therefore, AND circuit 124 of each stage fixes an output to 0 when the input value of register 6 is 0, and outputs the input value of shift register 4 directly when the value of register 6 is 1.

Also, AND circuit 125 of the first stage inputs the value of the first stage of shift register 4 and the value of the second stage of shift register 6, and outputs a result of AND operation. Therefore, AND circuit 125 of the first stage fixes an output to 0 when the input value of register 6 is 0, and outputs the input value of shift register 4 directly when the input value of register 6 is 1.

AND circuit 125 of the stages other than the first stage inputs a value of selector 122 of (i-1) stage and a value of (i+1) stage of shift register 6, and outputs a result of AND operation. Therefore, AND circuit 125 of the stages other than the first stage fixes an output to 0 when the input value of register 6 is 0, and outputs the input value of selector 122 of (i-1) stage directly when the value of register 6 is 1.

As a result, in a series of operations of convolutional code processing shown in the third embodiment, since the value of control signal A inserted to the corresponding sector 122 is "0" at the portion where the bit value of register 6 is "0", two inputs of exclusive OR circuit 121 are fixed to "0" by AND circuits 124 and 125. Also, the value of first input data of selector 122 and that of second input data are set to "0" or "1".

Therefore, in exclusive OR circuit 121 and selector 122, since input data is unchanged and no switch changing operation is performed, power consumption can be largely reduced in convolutional code processing and turbo code processing.

The above embodiment was explained using the exclusive OR circuit and AND circuit as a circuit for fixing data to be input to the selector. However, the present invention is not limited to these circuits, and the same effect can be obtained even if other circuits such as an NAND circuit, a latch circuit, etc. are used.

Moreover, this embodiment can be applied to cascade exclusive OR selection circuits 12, 26 shown in each of third, fourth, seventh, and eighth embodiments.

(Eleventh Embodiment)

An eleventh embodiment is a specific form, which aims to carry out processing for inserting a known bit flexibly and speedily in convolutional code processing.

Figure 27:
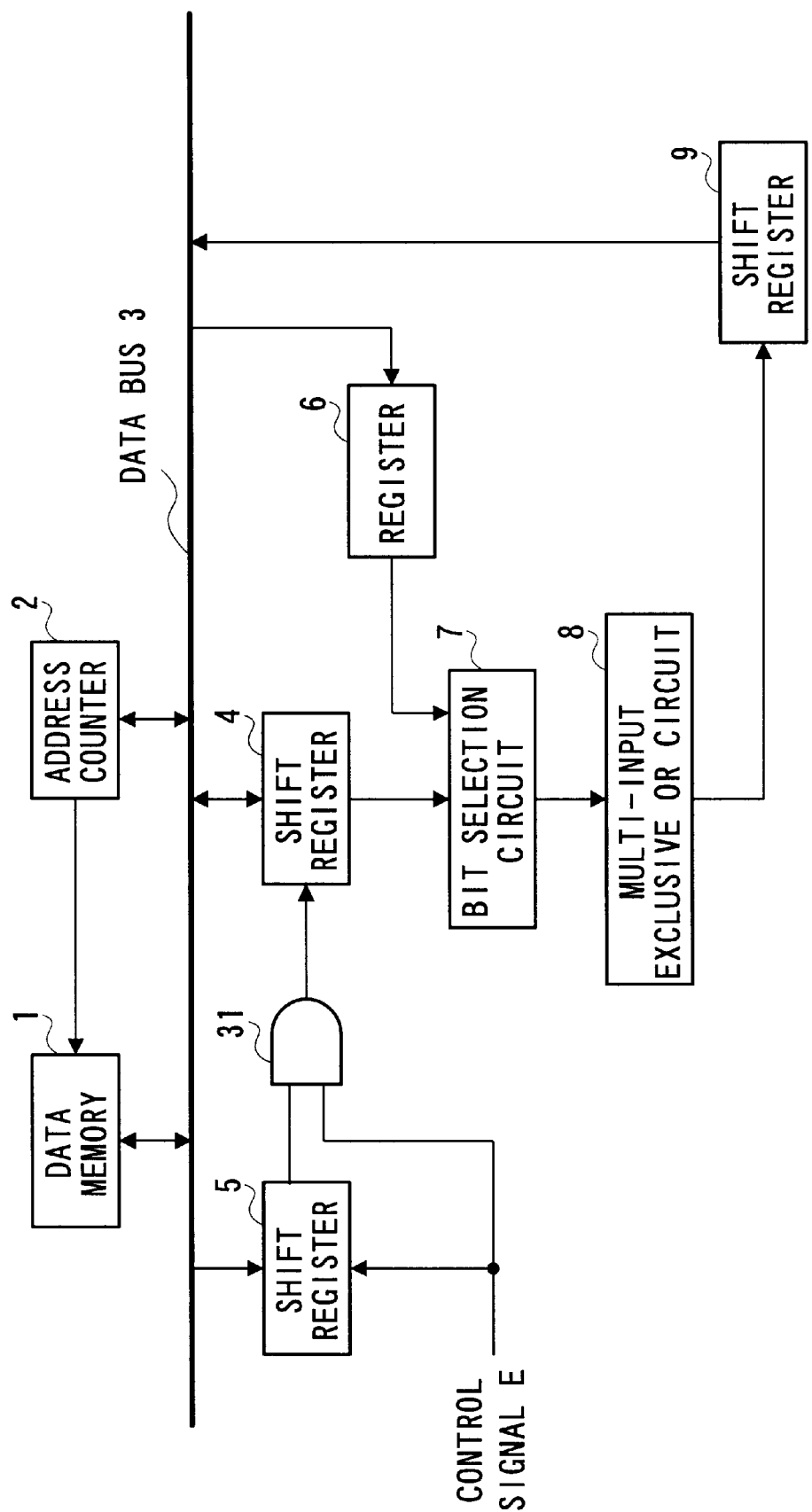
FIG. 27 a block diagram showing a configuration of an operation processing apparatus according to an eleventh embodiment.

FIG. 27 is a block diagram showing a configuration of an operation processing apparatus according to the eleventh embodiment. In the operation processing apparatus shown in FIG. 27, the same reference numerals as those of FIG. 1 are added to configuration portions common to FIG. 1, and the explanation will be omitted.

The operation processing apparatus shown in FIG. 27 adopts a configuration in which AND circuit 31 is added to the operation processing apparatus shown in FIG. 1, and control signal E is input to shift register 5 and AND circuit 31.

Control signal E is "0" when the known bit is inserted as input data, and "1" in the other case. When control signal E is "1", since an output of shift register is directly input to shift register 4 through AND circuit 31, the operation of the operation processing apparatus of FIG. 27 is the same as that of FIG. 1.

Since the output of shift register 5 is fixed to "0" by AND circuit 31 when control signal E is set to "1", it is possible to input "0" as known data to shift register 4.

At this time, other input data stored in shift register 5 is retained without being shifted. This eliminates the need for saving/returning the content of the shift register and for replacing it with known data Therefore, processing for inserting the known bit can be performed even in the middle of input data, and convolutional code processing and turbo code processing can be carried out flexibly and speedily.

The above embodiment was explained using the AND circuit as a circuit for fixing data to be input to the selector. However, the present invention is not limited to this circuit, and the same effect can be obtained even if other circuits such as an NAND circuit, a latch circuit, etc. are used.

Moreover, this embodiment can be applied to any one of first to ninth embodiments.

As explained above, according to the operation processing apparatus of the present invention and the operation processing method, there are provided a data register formed of a first shift register, and a second register for shift inputting uncoded data to the first shift register, and exclusive OR operations are simultaneously performer with respect to all bit data selected from data stored in the first shift register. This makes it possible to efficiently perform convolutional code processing and turbo code processing at high speed.

Also, the apparatus having a plurality of multi-input exclusive OR circuits can perform error correction processing even when the number of bits as a target of exclusive OR operation varies.

Moreover, the apparatus having a cascade exclusive OR selection circuit can reduce an area of a wiring region at the time of forming LSI in addition to the aforementioned effect, so that reduction in cost can be improved.

Furthermore, the use of the circuit for fixing data makes it possible to further reduce power consumption of convolutional code processing and turbo code processing and to improve high-speed performance thereof.

It should be noted that the operation processing apparatus explained in each embodiment can be incorporated into DSP, and this DSP can be incorporated into an error correction decoder provided in a communication terminal apparatus for performing radio communications and a base station apparatus, etc.

The present invention is not limited to the above described embodiments, and various variations and modifications may be possible without departing from the scope of the present invention.

This application is based on the Japanese Patent Applications No. HEI 9-142729 filed on May 30, 1997, No. HEI 10-148113 filed on May 28, 1998, and No. HEI 11-294816 filed on Oct. 18, 1999, entire content of which is expressly incorporated by reference herein.

What is claimed is:

1. An operation processing apparatus comprising:
   a first shift register for inputting uncoded data and storing operation target data;
   a second shift register for shift outputting uncoded data;
   first bit position information retaining means for retaining first bit position information showing a position of bits to be used in an exclusive OR operation;
   first bit selection means for s electing operation bits to be used in the exclusive OR operation from configuration bits of said operation target data based on said first bit position information; and
   first exclusive OR operating means for executing exclusive OR operations of all the operation bits selected by said first bit selection means.

2. The operation processing apparatus according to claim 1, wherein said first exclusive OR operating means comprises a plurality of multi-input exclusive OR operation circuits each having a different number of input bit, and first output data selection means for selecting at least one output data from output data of said plurality of multi-input exclusive OR operation circuits.

3. The operation processing apparatus according to claim 1, further comprising third fixing means for fixing uncoded data, which is input to said first shift register when a known bit is inserted, to "0" and for retaining uncoded data stored in said second shift register without being shifted.

4. The operation processing apparatus according to claim 1, further comprising:
   second bit position information retaining means for retaining second bit position information showing a position of bits to be used in an exclusive OR operation;
   second bit selection means for selecting operation bits to be used in the exclusive OR operation from configuration bits of said first shift register and shift outputs of said second shift register based on said second bit position information; and
   second exclusive OR operating means for executing exclusive OR operations of all the operation bits selected by said second bit selection means, wherein said first shift register stores uncoded data output from said second exclusive OR operation means as an operation target data, said second shift register shift outputs uncoded data to said second bit selection means, and said first bit selection means selects operation bits using each bit of said first shift register and an output of said second exclusive OR operation means.

5. The operation processing apparatus according to claim 4, wherein said second exclusive OR operating means comprises a plurality of multi-input exclusive OR operation circuits each having a different number of input bit, and second output data selection means for selecting at least one output data from output data of said plurality of multi-input exclusive OR operation circuits.

6. The operation processing apparatus according to claim 4, further comprising change means for outputting either uncoded data shift output from said second shift register or uncoded data output from second multi-input exclusive OR means to said first shift register and first multi-input exclusive OR means.

7. An operation processing apparatus comprising:
   a first shift register for inputting uncoded data and storing operation target data;
   a second shift register for shift inputting uncoded data;
   first bit position information retaining means for retaining first bit position information showing a position of bits to be used in an exclusive OR operation;
   first determining means for determining whether or not bits, which are present before the previous stage of each bit of said first shift register, are used in an exclusive OR operation; and
   first cascade exclusive OR selection means for connecting an exclusive OR circuit with two inputs and one output and a selection circuit with three inputs and one output in a multi-stage cascade manner as a configuration unit, and for executing an exclusive OR operation and a selective operation.

8. The operation processing apparatus according to claim 7, further comprising first bit position selection means, which has a plurality of bit position information retaining means, for selecting an output of any one of said plurality of bit position information retaining means so as to output said selected output to said selection circuits in said first cascade exclusive OR selection means.

9. The operation processing apparatus according to claim 7, wherein said first cascade exclusive OR selection means connects said exclusive OR circuit and said selection circuit in a multi-stage cascade manner such that an output of said exclusive OR circuit is input as second input data of said selection circuit, an output of said selection circuit is input as third input data of a selection circuit of a next stage and as an input of said exclusive OR circuit, and said first cascade exclusive OR selection means connects said first shift register, said exclusive OR circuit and said selection circuit in a multi-stage cascade manner such that the respective bit outputs of said first shift register are input as first input data of said selection circuit and as input data of said exclusive OR circuit in order, and said first cascade exclusive OR selection means connects said second shift register, said exclusive OR circuit and said selection circuit in a multi-stage cascade manner such that a shift output of said second shift register is input as third input data of the first stage of said selection circuit.

10. The operation processing apparatus according to claim 9, further comprising first fixing means having the same number as that of the configuration units, for fixing input data of said exclusive OR circuit of said first cascade exclusive OR selection means, which corresponds to a stage whose first bit position information is "0", and first input data of said selection circuit to "0".

11. The operation processing apparatus according to claim 10, wherein said first fixing means comprises a first AND circuit for fixing data, which is input to said exclusive OR circuit and said selection circuit from said first shift register at the stage whose bit position information is "0", to "0" and a second AND circuit for fixing data, which is input to said exclusive OR circuit from said second shift register at the stage whose bit position information is "0" or the selection circuit of the previous stage, to "0".

12. The operation processing apparatus according to claim 7, further comprising:

second bit position information retaining means for retaining second bit position information showing a position of a bit to be used in an exclusive OR operation;

second determining means for determining whether or not bits, which are present before the previous stage of each bit of said first shift register, are used in an exclusive OR operation; and second cascade exclusive OR selection means for connecting an exclusive OR circuit with two inputs and one output and a selection circuit with three input and one output in a multi-stage cascade manner as a configuration unit, and for executing an exclusive OR operation and a selective operation using the respective bits of said first shift register and a shift output of said second shift register based on said second bit position information and the determination result of said second determining means, wherein said first register stores uncoded data output from said second cascade exclusive OR selection means as operation target data, said second shift register shift outputs uncoded data to said second cascade exclusive OR selection means, and said first cascade exclusive OR selection means executes an exclusive OR operation and a selective operation using the respective bits of said first shift register and an output of said second cascade exclusive OR selection means.

13. The operation processing apparatus according to claim 12, wherein said second cascade exclusive OR selection means connects said exclusive OR circuit and said selection circuit in a multi-stage cascade manner such that a output of said exclusive OR circuit is input as second input data of said selection circuit, an output of said selection circuit is input as third input data of a selection circuit of a next stage and as input data of said exclusive OR circuit, and said second cascade exclusive OR selection means connects said first shift register, said exclusive OR circuit and said selection circuit in a multi-stage cascade manner such that the respective bit outputs of said first register are input as first input data of said selection circuits and as input data of said exclusive OR circuits in order, and said second cascade exclusive OR selection means connects said second shift register, said exclusive OR circuit and said selection circuit in a multi-stage cascade manner such that a shift output of said second shift register is input as third input data of the first stage of said selection circuit.

14. The operation processing apparatus according to claim 13, further comprising second fixing means for fixing input data of said exclusive OR circuit of said second cascade exclusive OR selection means, which corresponds to a stage whose second bit position information is "0", and first input data of said selection circuit to "0".

15. The operation processing apparatus according to claim 14, wherein said second fixing means comprises a third AND circuit for fixing data, which is input to said exclusive OR circuit and said selection circuit from said first shift register at the stage whose bit position information is "0", to "0" and a fourth AND circuit for fixing data, which is input to said exclusive OR circuit from said second shift register at the stage whose bit position information is "0" or the selection circuit of the previous stage, to "0".

16. A digital signal processor having an operation processing apparatus, said operation processing apparatus comprising:

a first shift register for inputting uncoded data and storing operation target data;

a second shift register for shift inputting uncoded data;

first bit position information retaining means for retaining first bit position information showing a position of bits to be used in an exclusive OR operation;

first bit selection means for selecting operation bits to be used in the exclusive OR operation from configuration bits of said operation target data based on said first bit position information; and first exclusive OR operating means for executing exclusive OR operations of all the operation bits selected by said first bit selection means.

17. A mobile station apparatus having an operation processing apparatus, said operation processing apparatus comprising:

a first shift register for inputting uncoded data and storing operation target data;

a second shift register for shift inputting uncoded data;

first bit position information retaining means for retaining first bit position information showing a position of bits to be used in an exclusive OR operation;

first bit selection means for selecting operation bits to be used in the exclusive OR operation from configuration bits of said operation target data based on said first bit position information; and first exclusive OR operating means for executing exclusive OR operations of all the operation bits selected by said first bit selection means.

18. A base station apparatus having an operation processing apparatus, said operation processing apparatus comprising:

a first shift register for inputting uncoded data and storing operation target data;

a second shift register for shift inputting uncoded data;

first bit position information retaining means for retaining first bit position information showing a position of bits to be used in an exclusive OR operation;

first bit selection means for selecting operation bits to be used in the exclusive OR operation from configuration bits of said operation target data based on said first bit position information; and first exclusive OR operating means for executing exclusive OR operations of all the operation bits selected by said first bit selection means.

19. An operation processing method comprising the steps of:

storing operation target data to one of two shift registers;

shift outputting uncoded data from the other shift register;

selecting bit data to be used in an exclusive OR operation from operation target data based on first bit position information showing a position of bits to be used in the exclusive OR operation; and executing the exclusive OR operations of all selected operation bits, simultaneously.

20. An operation processing method comprising the steps of:

storing operation target data to one of two shift registers;

shift outputting uncoded data from the other shift register;

determining whether or not bits, which are present before the previous stage of said operation target data, are used in an exclusive OR operation; and executing the exclusive OR operation and a selection operation with respect to said operation target data based on first bit position information, which shows whether or not each bit of operation target data is used in the exclusive OR operation, and said determination result.

* * * * *

UNITED STATES PATENT AND TRADEMARK OFFICE
CERTIFICATE OF CORRECTION

PATENT NO.   : 6,523,146 B1
DATED        : February 18, 2003
INVENTOR(S)  : T. Ishikawa It is certified that error appears in the above-identified patent and that said Letters Patent is hereby corrected as shown below:

Column 21,
Line 24, "s electing" should be -- selecting --.

Signed and Sealed this

Eleventh Day of November, 2003

JAMES E. ROGAN
*Director of the United States Patent and Trademark Office*